(12) United States Patent
Kim et al.

(10) Patent No.: US 9,960,046 B2
(45) Date of Patent: May 1, 2018

(54) METHODS OF MANUFACTURING SEMICONDUCTOR DEVICE HAVING A BLOCKING INSULATION LAYER

(71) Applicants: Jung Ho Kim, Seongnam-si (KR); Bio Kim, Seoul (KR); Jaeyoung Ahn, Seongnam-si (KR); Dongchul Yoo, Seongnam-si (KR)

(72) Inventors: Jung Ho Kim, Seongnam-si (KR); Bio Kim, Seoul (KR); Jaeyoung Ahn, Seongnam-si (KR); Dongchul Yoo, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/609,099

(22) Filed: May 31, 2017

(65) Prior Publication Data
US 2018/0090329 A1    Mar. 29, 2018

(30) Foreign Application Priority Data
Sep. 23, 2016   (KR) ........................ 10-2016-0122406

(51) Int. Cl.
*H01L 21/28* (2006.01)
*H01L 27/1157* (2017.01)
*H01L 27/11582* (2017.01)
*H01L 21/02* (2006.01)

(52) U.S. Cl.
CPC .... *H01L 21/28282* (2013.01); *H01L 21/0217* (2013.01); *H01L 21/0223* (2013.01); *H01L 21/02164* (2013.01); *H01L 27/1157* (2013.01); *H01L 27/11582* (2013.01)

(58) Field of Classification Search
CPC .......... H01L 21/28282; H01L 21/8229; H01L 21/823487; H01L 21/8239
See application file for complete search history.

(56) References Cited

U.S. PATENT DOCUMENTS

| | | | |
|---|---|---|---|
| 6,551,948 B2 | 4/2003 | Ohmi et al. | |
| 7,679,133 B2 | 3/2010 | Son et al. | |
| 8,330,207 B2 | 12/2012 | Baek et al. | |
| 8,553,466 B2 | 10/2013 | Han et al. | |

(Continued)

FOREIGN PATENT DOCUMENTS

KR          100934532 B1   12/2009

*Primary Examiner* — Hoai V Pham
(74) *Attorney, Agent, or Firm* — Harness, Dickey & Pierce, P.L.C.

(57) ABSTRACT

A method of manufacturing a semiconductor device includes forming insulation layers and sacrificial layers that are alternately and repeatedly stacked on top of each other a substrate, forming a vertical hole that penetrates the insulation layers and the sacrificial layers, and forming a vertical channel structure in the vertical hole. The forming the vertical channel structure includes forming a blocking insulation layer, a charge storage layer, a tunnel insulation layer, and a semiconductor pattern. The forming the blocking insulation layer includes forming a first oxidation target layer, oxidizing the first oxidation target layer to form a first sub-blocking layer, and forming a second sub-blocking layer. The first sub-blocking layer is formed between the second sub-blocking layer and an inner sidewall of the vertical hole.

20 Claims, 32 Drawing Sheets

(56) References Cited

U.S. PATENT DOCUMENTS

| | | |
|---|---|---|
| 8,559,235 B2 | 10/2013 | Yoon et al. |
| 8,654,587 B2 | 2/2014 | Yoon et al. |
| 8,907,397 B2 | 12/2014 | Yasuda |
| 8,987,805 B2 | 3/2015 | Nam et al. |
| 9,252,230 B2 | 2/2016 | Ko |
| 2011/0233648 A1 | 9/2011 | Seol et al. |
| 2015/0060977 A1 | 3/2015 | Lee et al. |
| 2015/0155297 A1 | 6/2015 | Eom et al. |
| 2015/0263126 A1 | 9/2015 | Shingu et al. |
| 2016/0133643 A1 | 5/2016 | Choi et al. |
| 2017/0154895 A1* | 6/2017 | Huo ................ H01L 27/11582 |

* cited by examiner

METHODS OF MANUFACTURING SEMICONDUCTOR DEVICE HAVING A BLOCKING INSULATION LAYER

CROSS-REFERENCE TO RELATED APPLICATIONS

This U.S. nonprovisional patent application claims priority under 35 U.S.C § 119 to Korean Patent Application 10-2016-0122406 filed on Sep. 23, 2016 entire contents of which are hereby incorporated by reference.

BACKGROUND

Inventive concepts relate to a method of manufacturing a semiconductor device, and more particularly, to a method of manufacturing a three-dimensional semiconductor device.

Semiconductor devices may be highly integrated for satisfying high performance and low manufacture costs of semiconductor devices preferences by users. Integration of typical two-dimensional or planar semiconductor devices may be influenced by the area occupied by a unit memory cell, such that it is greatly influenced by the level of technology for forming fine patterns. However, technology for fine pattern sets a practical limitation.

Three-dimensional semiconductor devices having three-dimensionally arranged memory cells have been proposed. In order to mass produce three-dimensional semiconductor devices, new process technologies should be developed in such a manner that can provide a lower manufacture cost per bit than two-dimensional semiconductor devices while maintaining or exceeding their level of reliability.

SUMMARY

Inventive concepts relate to a method of manufacturing a semiconductor device having enhanced reliability and electrical property distribution.

Features of effects of example embodiments of inventive concepts will be clearly understood to those skilled in the art from the following description.

According to some example embodiments of inventive concepts, a method of manufacturing a semiconductor device may include forming insulation layers and sacrificial layers that are alternately and repeatedly stacked on top of each other on a substrate; forming a vertical hole that penetrates the insulation layers and the sacrificial layers; and forming a vertical channel structure in the vertical hole. The forming the vertical channel structure may include forming a blocking insulation layer, a charge storage layer, a tunnel insulation layer, and a semiconductor pattern. The forming the blocking insulation layer may include forming a first oxidation target layer, oxidizing the first oxidation target layer to form a first sub-blocking layer, and forming a second sub-blocking layer. The first sub-blocking layer may be between the second sub-blocking layer and an inner sidewall of the vertical hole.

According to some example embodiments of inventive concepts, a method of manufacturing a semiconductor device may include forming insulation layers and sacrificial layers that are alternately and repeatedly stacked on top of each other on a substrate, forming a vertical hole that penetrates the insulation layers and the sacrificial layers, and forming a vertical channel structure in the vertical hole. The forming the vertical channel structure may include forming a first sub-blocking layer on an inner sidewall of the vertical hole, and forming a second sub-blocking layer on an inner sidewall of the first sub-blocking layer. The forming the first sub-blocking layer may include forming a silicon nitride layer on the inner sidewall of the vertical hole, and oxidizing the silicon nitride layer.

According to some example embodiments of inventive concepts, a method of manufacturing a semiconductor device may forming a vertical hole that penetrates the a preliminary stack structure on a substrate and forming a blocking insulation layer in the vertical hole. The preliminary stack structure may include a plurality of first layers and a plurality of second layers that are alternately and repeatedly stacked on top of each other on the substrate. A material of the first layers may be different than a material of the second layers. The forming the blocking insulation layer may include forming a first oxidation target layer, oxidizing the first oxidation target layer to form a first sub-blocking layer, and forming a second sub-blocking layer. The first sub-blocking layer may be between the second sub-blocking layer and an inner sidewall of the vertical hole.

Details of some example embodiments of inventive concepts are included in the description and drawings.

DETAILED DESCRIPTION

Figure 1:
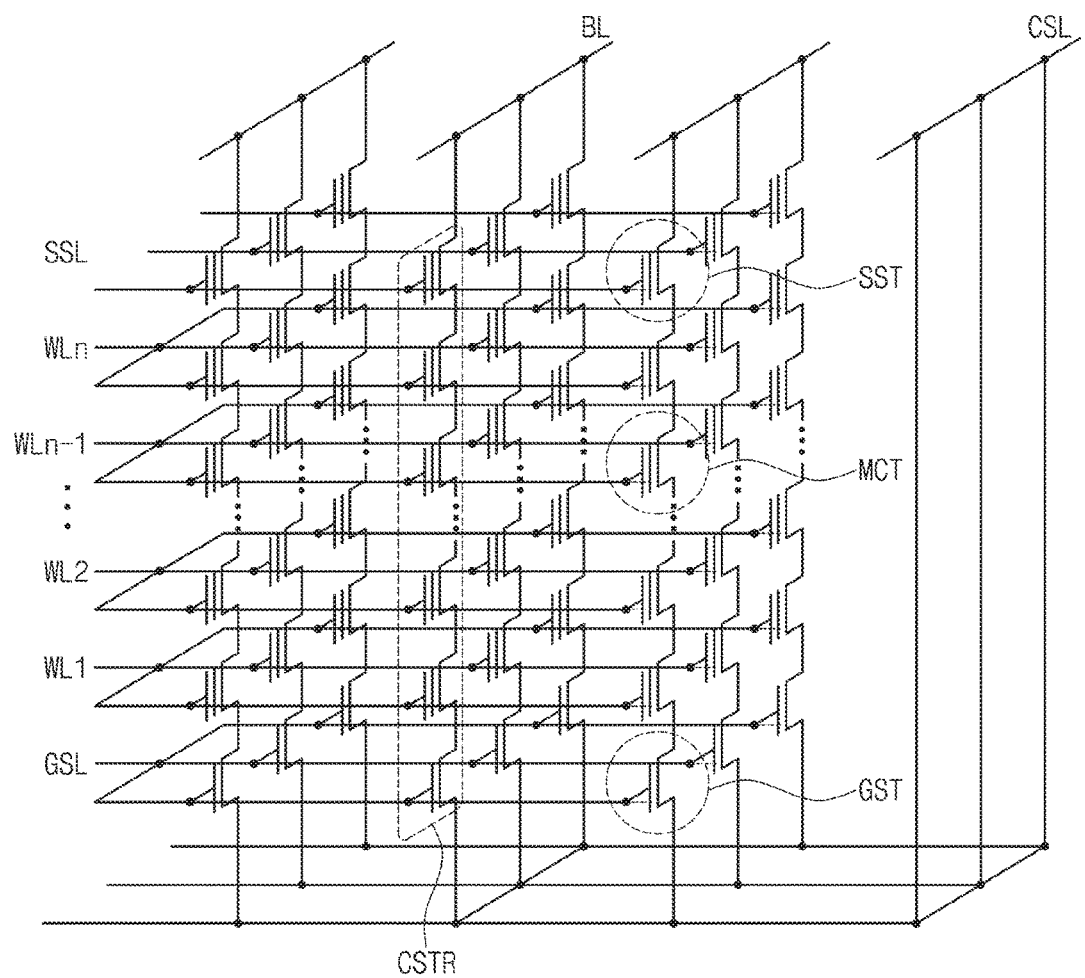
FIG. 1 is a simplified circuit diagram illustrating a cell array of a three-dimensional semiconductor device according to some example embodiments of inventive concepts.

It will be described hereinafter some example embodiments of inventive concepts with reference to the accompanying drawings. Like reference numerals may indicate like components throughout the description.

FIG. 1 is a simplified circuit diagram illustrating a cell array of a three-dimensional semiconductor device according to some example embodiments of inventive concepts. For example, a three-dimensional memory device may correspond to the three-dimensional semiconductor device according to some example embodiments of inventive concepts.

In some example embodiments, the cell array may be a three-dimensional (3D) memory array that includes three-dimensionally arranged memory cells, a plurality of word lines electrically connected to the memory cells, and a plurality of bit lines electrically connected to the memory cells. The 3D memory array may be monolithically formed on a substrate (e.g., semiconductor substrate such as silicon, or semiconductor-on-insulator substrate). The 3D memory array may include vertical NAND strings that are vertically oriented such that at least one memory cell is located over another memory cell. The at least one memory cell may comprise a charge trap layer.

Referring to FIG. 1, a cell array of the three-dimensional semiconductor device according to some example embodiments may include a common source line CSL, a plurality of bit lines BL, and a plurality of cell strings CSTR disposed between the common source line CSL and the bit lines BL.

The common source line CSL may be a conductive thin layer disposed on a substrate or an impurity region formed in the substrate. The bit lines BL may be conductive patterns (e.g., metal lines) spaced apart from and disposed on the substrate. The bit lines BL may be two-dimensionally arranged and a plurality of cell strings CSTR may be connected in parallel to each of the bit lines BL. The cell strings CSTR may be connected in common to the common source line CSL. For example, a plurality of the cell strings CSTR may be disposed between a plurality of the bit lines BL and the common source line CSL. In some example embodiments, the common source line CSL may be provided in plural, which may be two-dimensionally arranged. In this configuration, the common source lines CSL may be supplied with the same voltage or electrically controlled independently of each other.

Each of the cell strings CSTR may include a ground select transistor GST connected to the common source line CSL, a string select transistor SST connected to the bit line BL, and a plurality of memory cell transistors MCT disposed between the ground and string select transistors GST and SST. The ground select transistor GST, the string select transistor SST, and the memory cell transistors MCT may be connected in series.

The common source line CSL may be connected in common to sources of the ground select transistors GST. In addition, a ground select line GSL, a plurality of word lines WL1 to WLn, and a plurality of string select lines SSL disposed between the common source line CSL and the bit lines BL may be respectively used as gate electrodes of the ground select transistor GST, the memory cell transistors MCT, and the string select transistor SST. Moreover, each of the memory cell transistors MCT may include a data storage element. Even though FIG. 1 illustrates an example where the ground selection transistor GST has a different structure than the memory cell transistors MCT, inventive concepts are not limited thereto. In some example embodiments, the ground selection transistor may include a charge trap similar to the memory cell transistors MCT.

Figure 2A:
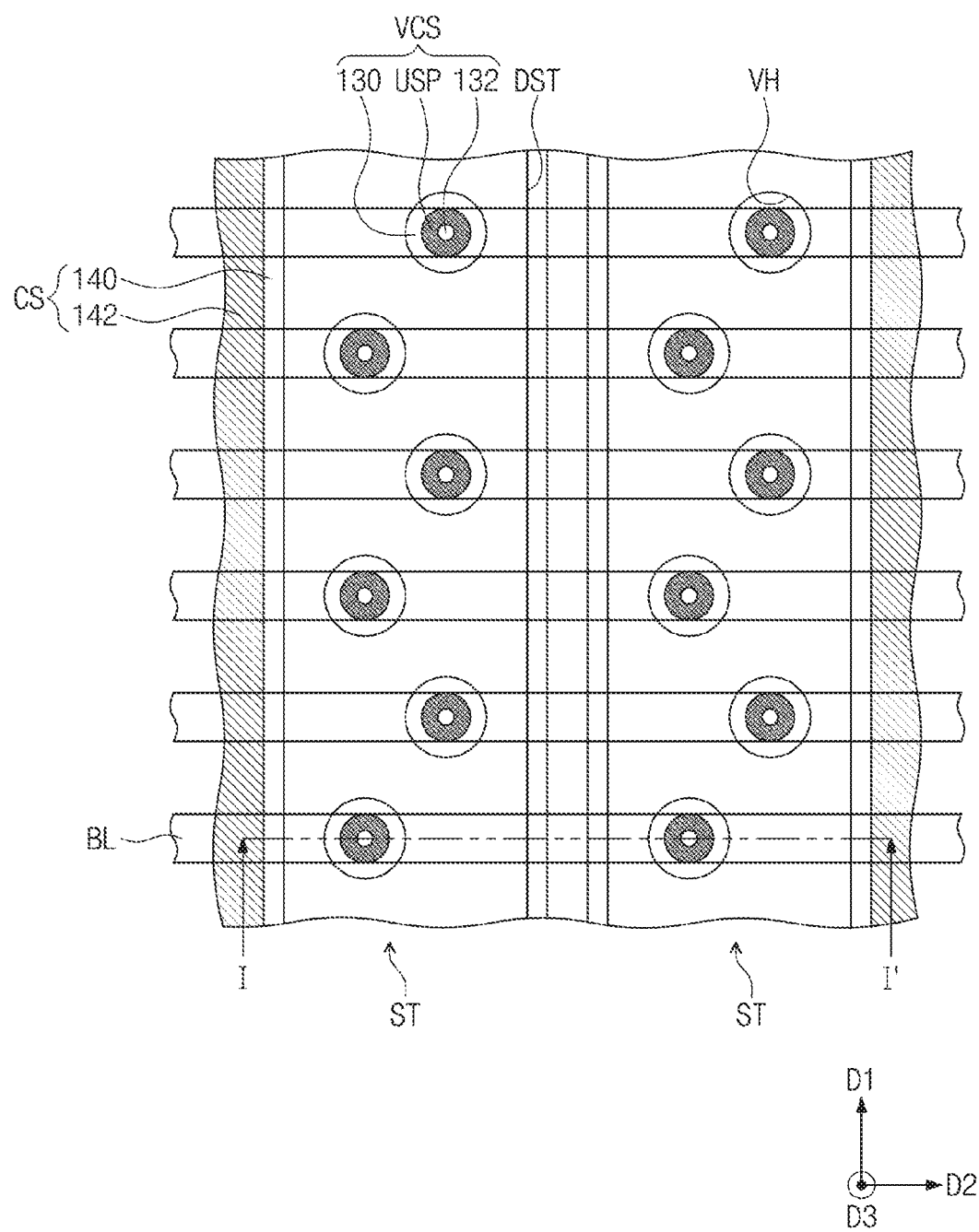
FIG. 2A is a plan view illustrating a semiconductor device according to some example embodiments of inventive concepts.
Figure 2B:
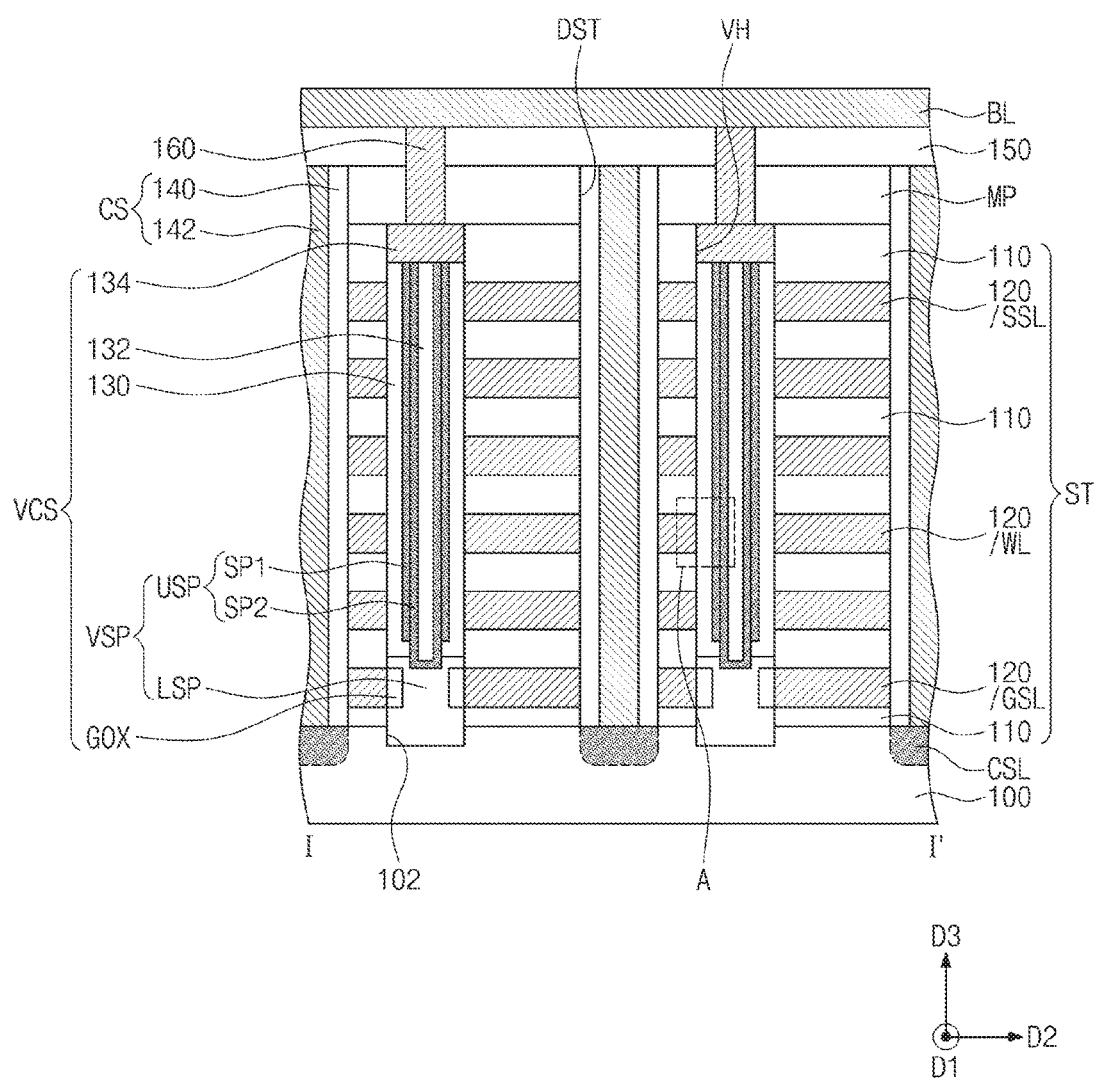
FIG. 2B is a cross-sectional view taken along line I-I' of FIG. 2A.
Figure 3A:
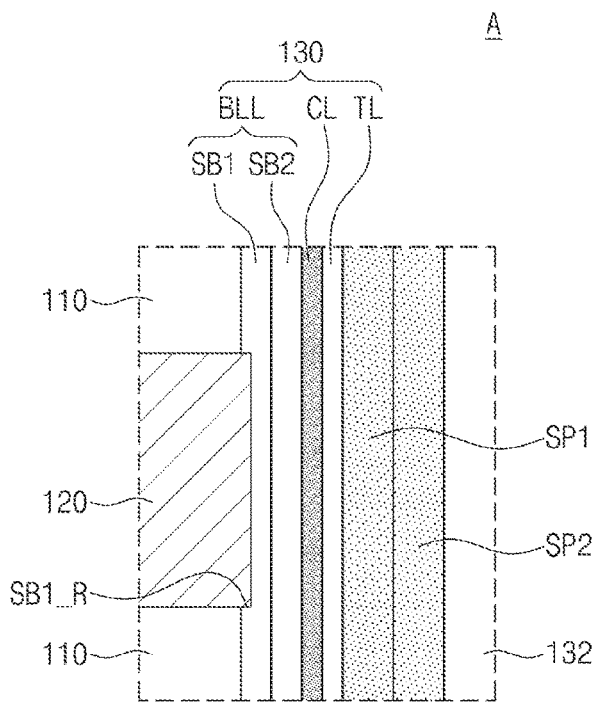
FIGS. 3A and 3B are enlarged views of section A shown in FIG. 2B.
Figure 3B:
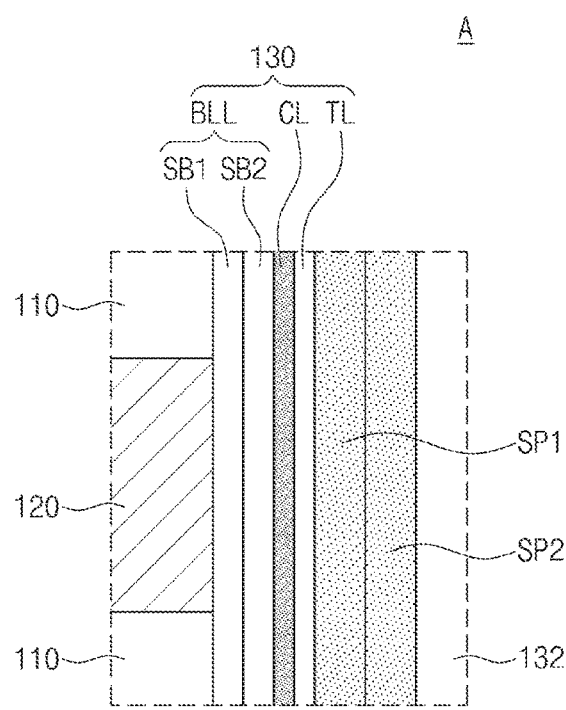

FIG. 2A is a plan view illustrating a semiconductor device according to some example embodiments of inventive concepts. FIG. 2B is a cross-sectional view taken along line I-I' of FIG. 2A. FIGS. 3A and 3B are enlarged views of section A shown in FIG. 2B.

Referring to FIGS. 2A and 2B, a semiconductor device may include a substrate 100, stack structures ST, vertical channel structures VCS, and bit lines BL.

The substrate 100 may be a semiconductor substrate. For example, the substrate 100 may include a single crystalline silicon layer, a single crystalline germanium layer, a silicon layer formed on a germanium layer, a silicon layer formed on an insulation layer, or a polycrystalline semiconductor layer formed on an insulation layer.

The stack structures ST may be disposed between the substrate 100 and the bit lines BL. In a plan view, each of the stack structures ST may extend in a first direction D1. Separation trenches DST may be provided to extend in the first direction D1 and make the stack structures ST spaced apart from each other in a second direction D2 intersecting (e.g., perpendicular to) the first direction D1. The separation trenches DST may reveal a top surface of the substrate 100. Each of the stack structures ST may include insulation patterns 110 and electrode patterns 120 that are alternately and repeatedly stacked.

The insulation patterns 110 may include an insulating material. For example, the insulation patterns 110 may include silicon oxide. A lowermost one of the insulation patterns 110 may have a thickness less than those of other insulation patterns 110.

A lowermost one 120/GSL of the electrode patterns 120 may be a ground select line, an uppermost one 120/SSL of the electrode patterns 120 may be a string select line, and other electrode patterns 120/WL between the ground select line and the string select line may be word lines. The electrode patterns 120 may include a conductive material. For example, the electrode patterns 120 may include a metal such as tungsten (W), aluminum (Al), titanium (Ti), tantalum (Ta), cobalt (Co), or copper (Cu).

Each of the stack structures ST may include vertical holes VH penetrating the electrode patterns 120 and exposing the substrate 100. In some example embodiments, the vertical holes VH may extend to recess the top surface of the substrate 100. In this configuration, each of the vertical holes VH may include a recess region 102 formed at the top surface of the substrate 100. FIG. 2A illustrates that the vertical holes VH included in one stack structure ST may constitute two columns extending in the first direction D1, but inventive concepts is not limited thereto. For example, the vertical holes VH included in one stack structure ST may constitute four or nine columns extending in the first direction D1. As shown in FIG. 2A, in a plan view, the vertical holes VH may be arranged in a zigzag fashion along the first direction D1. Inventive concepts, however, is not limited thereto; for example, the vertical holes VH may be variously arranged.

A vertical channel structure VCS may be provided in each of the vertical holes VH. The vertical channel structure VCS may include a vertical semiconductor pattern VSP, a data storage structure 130, a buried insulator 132, and a conductive pad 134.

The vertical semiconductor pattern VSP may include a lower semiconductor pattern LSP and an upper semiconductor pattern USP. The lower semiconductor pattern LSP may be provided at a lower portion of the vertical hole VH and in contact with the substrate 100. The lower semiconductor pattern LSP may have a pillar shape that fills the recess region 102 and the lower portion of the vertical hole VH. The lower semiconductor pattern LSP may have a top surface higher than a top surface of the lowermost electrode pattern 120/GSL and may also have a bottom surface lower than the top surface of the substrate 100. A gate dielectric layer GOX may be provided between the lower semiconductor pattern LSP and the lowermost electrode pattern 120/GSL. The gate dielectric layer GOX may include, for example, silicon oxide. The lower semiconductor pattern LSP may include silicon that is formed by a selective epitaxial growth process in which the substrate 100 exposed by the vertical hole VH is used as a seed.

The upper semiconductor pattern USP may be disposed on the lower semiconductor pattern LSP. The upper semiconductor pattern USP may be electrically connected to the substrate 100 through the lower semiconductor pattern LSP.

The upper semiconductor pattern USP may extend along a third direction D3 substantially perpendicular to the substrate 100. The upper semiconductor pattern USP may have an end electrically connected to the lower semiconductor pattern LSP and an opposite end electrically connected to the bit line BL. The conductive pad 134 may be provided on the opposite end of the upper semiconductor pattern USP. The conductive pad 134 may include, for example, metal or doped polycrystalline silicon. The upper semiconductor pattern USP may have a hollow pipe shape or a macaroni shape. The upper semiconductor pattern USP may have a closed bottom end. The upper semiconductor pattern USP may have an inside filled with the buried insulator 132. The upper semiconductor pattern USP may have a bottom surface positioned lower than a topmost surface of the lower semiconductor pattern LSP.

In more detail, the upper semiconductor pattern USP may include a first semiconductor pattern SP1 and a second semiconductor pattern SP2. The first semiconductor pattern SP1 may be disposed on an inner sidewall of the vertical hole VH, and the second semiconductor pattern SP2 may be disposed on an inner sidewall of the first semiconductor pattern SP1. The first semiconductor pattern SP1 may have a pipe or macaroni shape whose top and bottom ends are open. The first semiconductor pattern SP1 may be spaced apart from the lower semiconductor pattern LSP. The second semiconductor pattern SP2 may have a pipe or macaroni shape whose bottom end is closed. The second semiconductor pattern SP2 may have an inside filled with the buried insulator 132. The second semiconductor pattern SP2 may be in contact with the lower semiconductor pattern LSP. In addition, the second semiconductor pattern SP2 may have a portion inserted into the lower semiconductor pattern LSP. The second semiconductor pattern SP2 may electrically connect the first semiconductor pattern SP1 to the lower semiconductor pattern LSP.

Referring further to FIGS. 3A and 3B, the data storage structure 130 may be disposed between the upper semiconductor pattern USP and at least one of the electrode patterns 120. The data storage structure 130 may include a blocking insulation layer BLL adjacent to the electrode patterns 120, a tunnel insulation layer TL adjacent to the upper semiconductor pattern USP, and a charge storage layer CL between the blocking insulation layer BLL and the tunnel insulation layer TL. The tunnel insulation layer TL may include, for example, silicon oxide. The charge storage layer CL may include at least one of, for example, silicon nitride, silicon oxynitride, silicon-rich nitride, nanocrystalline silicon, aluminum oxide ($Al_2O_3$), zirconium oxide (ZrO), hafnium oxide (HfO), or lanthanum oxide (LaO).

The blocking insulation layer BLL may include a plurality of sub-blocking layers SB1 and SB2. The sub-blocking layers SB1 and SB2 may include a first sub-blocking layer SB1 adjacent to the electrode patterns 120 and a second sub-blocking layer SB2 between the first sub-blocking layer SB1 and the charge storage layer CL. The first sub-blocking layer SB1 may be in contact with the inner wall of the vertical hole VH. Each of the first and second sub-blocking layers SB1 and SB2 may be a single layer extending along the third direction D3.

In some example embodiments, as shown in FIGS. 3A and 3B, only one second sub-blocking layer SB2 may be provided. Inventive concepts, however, is not limited thereto. For example, unlike those shown in FIGS. 3A and 3B, the second sub-blocking layer SB2 may be provided in plural. Each of the first and second sub-blocking layers SB1 and SB2 may have a thickness in the range from about 15 Å to about 45 Å.

Each of the first and second sub-blocking layers SB1 and SB2 may include silicon oxide. The first sub-blocking layer SB1 may include silicon oxide formed by an oxidation process. The second sub-blocking layer SB2 may include silicon oxide formed by an oxidation process and/or silicon oxide formed by a deposition process. Silicon oxide formed by an oxidation process may have a microstructure finer than that of silicon oxide formed by a deposition process, and thus may have high resistance to an etching process. In other words, under the same etching process, silicon oxide formed by an oxidation process may have an etching rate less than that of silicon oxide formed by a deposition process. When the first sub-blocking layer SB1 and/or the second sub-blocking layer SB2 include silicon oxide formed by an oxidation process, a very small amount of nitrogen may further be included in the first sub-blocking layer SB1 and/or the second sub-blocking layer SB2. For example, when the first sub-blocking layer SB1 and/or the second sub-blocking layer SB2 include silicon oxide formed by an oxidation process, nitrogen greater than 0.0 at % and less than or equal to about 0.1 at % may further be included in the first sub-blocking layer SB1 and/or the second sub-blocking layer SB2.

In some example embodiments, as shown in FIG. 3A, the first sub-blocking layer SB1 may include laterally recessed regions SB1_R. The laterally recessed regions SB1_R may correspond to the electrode patterns 120, and the electrode patterns 120 may partially be inserted into the laterally recessed region SB1_R respectively. Each of the laterally recessed regions SB1_R may have a depth less than a thickness of the first sub-blocking layer SB1, and the second sub-blocking layer SB2 may not be exposed by the laterally recessed regions SB1_R.

In other example embodiments, as shown in FIG. 3B, the first sub-blocking layer SB1 may not substantially include laterally recessed regions, and, the electrode patterns 120 may not be inserted into the first sub-blocking layer SB1.

Common source lines CSL may be provided to have a desired (and/or alternatively predetermined) depth in upper portions of the substrate 100 that are exposed by the separation trenches DST. The common source lines CSL may be regions where impurities are doped in an upper portion of the substrate 100. The common source lines CSL may extend in the first direction D1 and spaced apart from each other in the second direction D2. In a plan view, the stack structures ST and the common source lines CSL may be arranged alternately and repeatedly in the second direction D2.

A contact structure CS may be disposed in each of the separation structures DST. The contact structure CS may be connected to a corresponding one of the common source lines CSL. The contact structure CS may extend in the third direction D3 along a sidewall of the stack structure ST. In addition, the contact structure CS may extend in the first direction D1 along the corresponding common source line CSL. Accordingly, in a plan view, the contact structure CS may have a rectangular shape or a linear shape extending in the first direction D1.

The contact structure CS may include a pair of spacers 140 and a common source contact 142 therebetween. The common source contact 142 may be connected to a corresponding one of the common source lines CSL. The common source contact 142 may include a conductive material. For example, the common source contact 142 may include a metal material (e.g., tungsten, copper, or aluminum) or a transition metal material (e.g., titanium or tantalum). Each of the spacers 140 may be disposed between the common source contact 142 and the stack structure ST. The spacers 140 may include an insulating material. For example, the spacers 140 may include silicon oxide, silicon nitride, and/or silicon oxynitride.

A mask pattern MP may be provided on each of the stack structures ST. The mask pattern MP may cover the vertical channel structure VCS. The mask pattern MP may include, for example, silicon oxide or silicon nitride. In some example embodiments, as shown in FIG. 2B, the contact structure CS may extend onto a sidewall of the mask pattern MP. In other example embodiments, unlike that shown in FIG. 2B, the contact structure CS may not extend onto the sidewall of the mask pattern MP, and the mask pattern MP may cover a top surface of the contact structure CS.

An interlayer dielectric layer 150 may be disposed on the mask patterns MP. The interlayer dielectric layer 150 may cover the contact structures CS. The interlayer dielectric layer 150 may include an insulating material. For example, the interlayer dielectric layer 150 may include one of silicon oxide, silicon nitride, silicon oxynitride, and a combination thereof.

Contact plugs 160 may be provided to penetrate the interlayer dielectric layer 150 and the mask patterns MP. Each of the contact plugs 160 may be electrically connected to the conductive pad 134. The contact plugs 160 may include metal (e.g., tungsten (W), copper (Cu), or aluminum (Al)) or doped silicon.

The bit lines BL may be disposed on the interlayer dielectric layer 150. Each of the bit lines BL may extend in the second direction D2 while running across the stack structures ST. Each of the bit lines BL may be connected through the contact plugs 160 to a plurality of the vertical channel structures VCS arranged in the second direction D2. The bit line BL may include a conductive material (e.g., tungsten (W)).

FIGS. 4A to 4K are cross-sectional views corresponding to line I-I' of FIG. 2A, illustrating a method of manufacturing a semiconductor device according to some example embodiments of inventive concepts. FIG. 4L is a plan view taken along line II-II' of FIG. 4B. Those parts substantially the same as those discussed with reference to FIGS. 2A, 2B, 3A and 3B are allocated the same reference numerals thereto, and a repetitive explanation thereof will be omitted for brevity of the description.

Figure 4A:
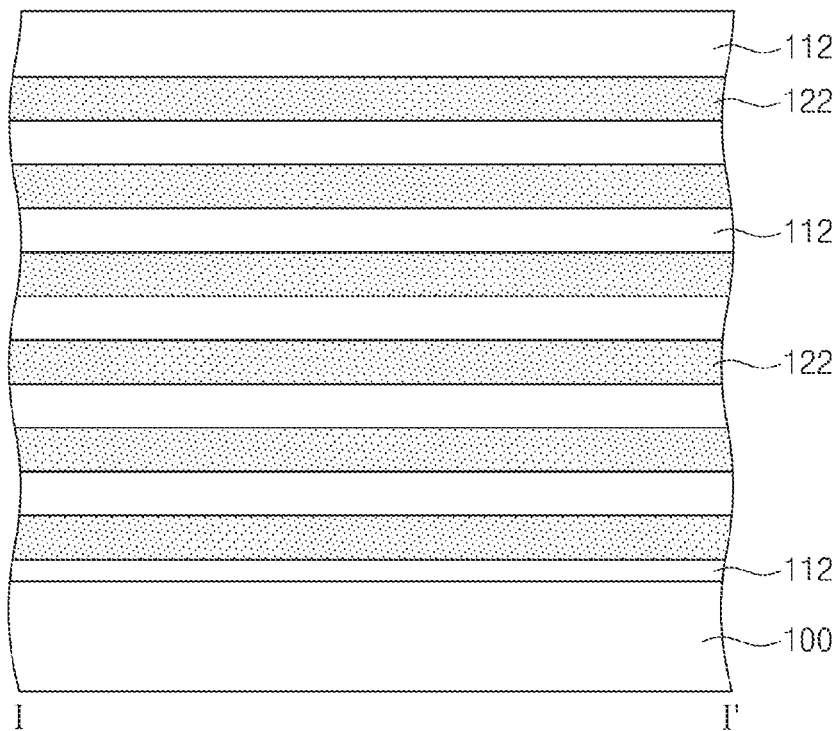
FIGS. 4A to 4K are cross-sectional views corresponding to line I-I' of FIG. 2A, illustrating a method of manufacturing a semiconductor device according to some example embodiments of inventive concepts.
Figure 4A:
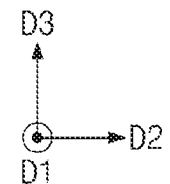

Referring to FIGS. 2A and 4A, insulation layers 112 and sacrificial layers 122 may be alternately and repeatedly formed on a substrate 100. A lowermost insulation layer 112 may have a thickness less than those of other insulation layers 112, and an uppermost insulation layer 112 may have a thickness greater than those of other insulation layers 112. The sacrificial layers 122 may include a material having an etch selectivity with respect to the insulation layers 112. For example, the insulation layers 112 may include silicon oxide, and the sacrificial layers 122 may include silicon nitride, silicon oxynitride layer, or polycrystalline silicon. For example, a chemical vapor deposition (CVD) process may be employed to form the insulation layers 112 and the sacrificial layers 122. The insulation layers 112 and the sacrificial layers 122 may be referred to as first layers and second layers, respectively.

Figure 4B:
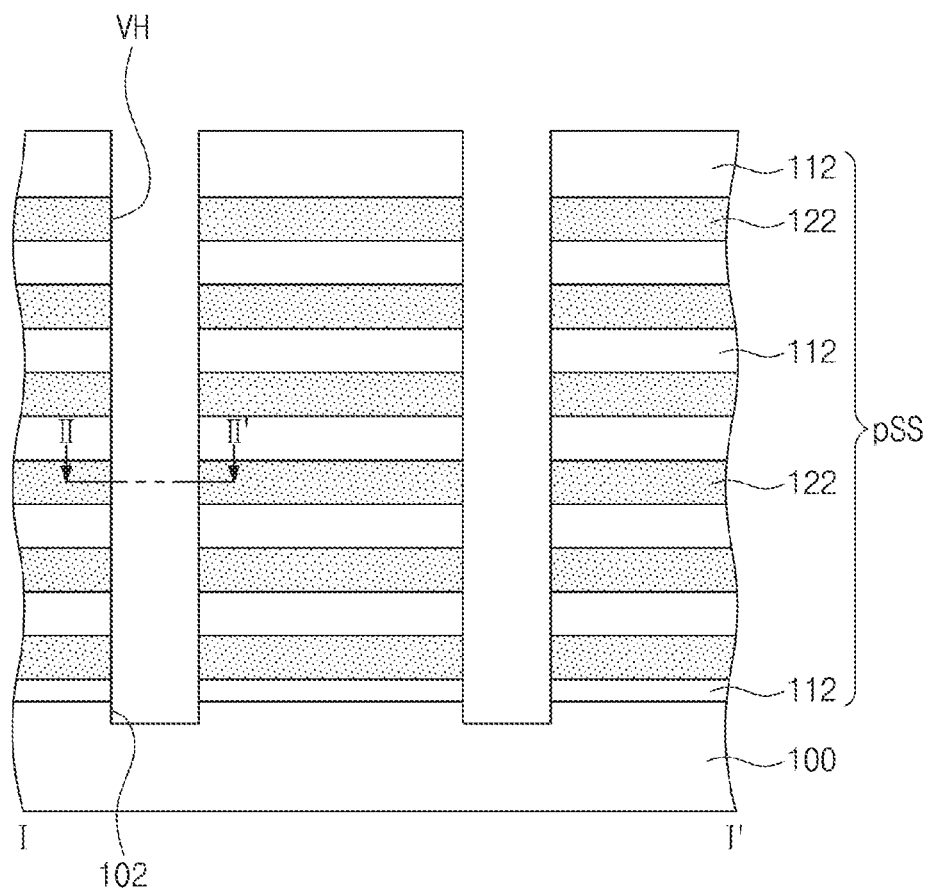
Figure 4C:
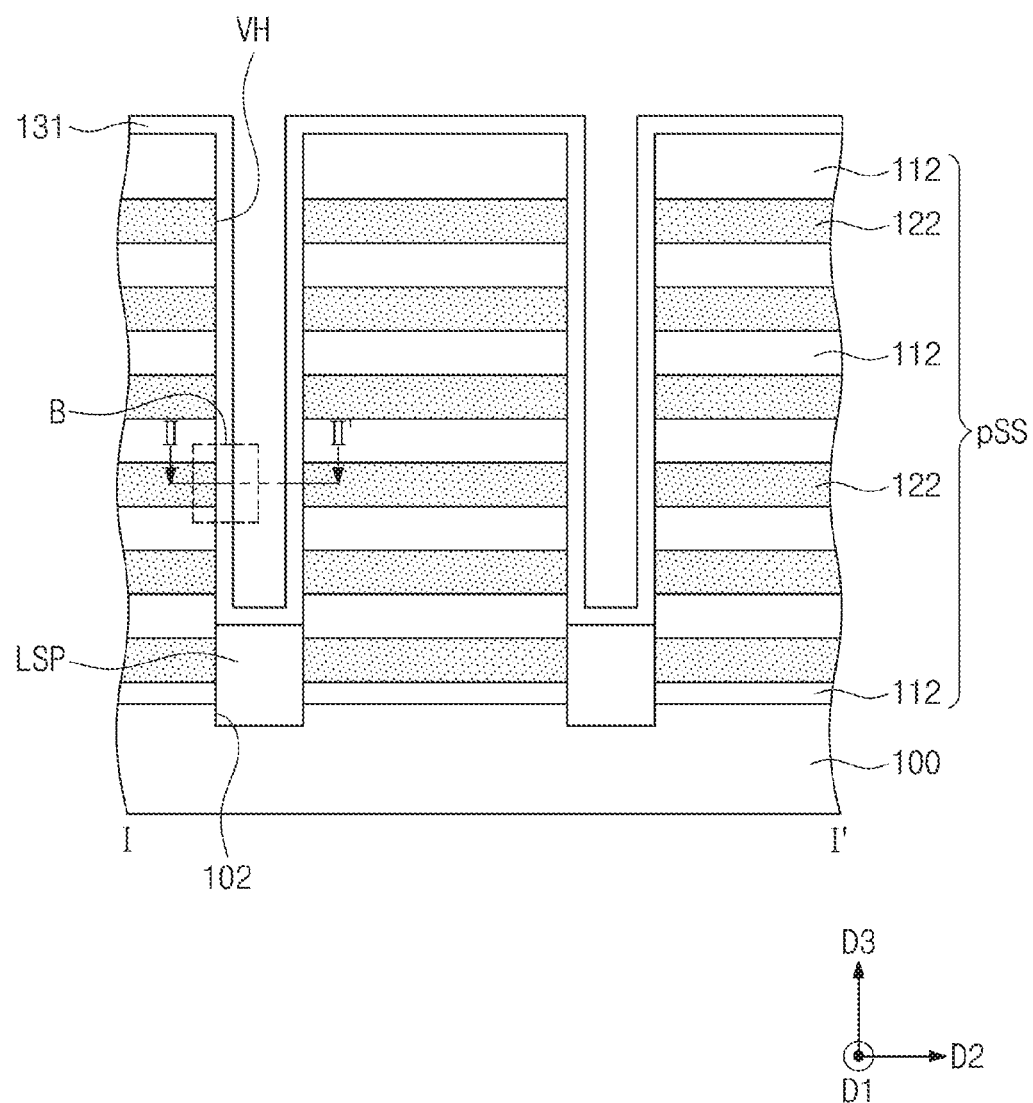
Figure 4D:
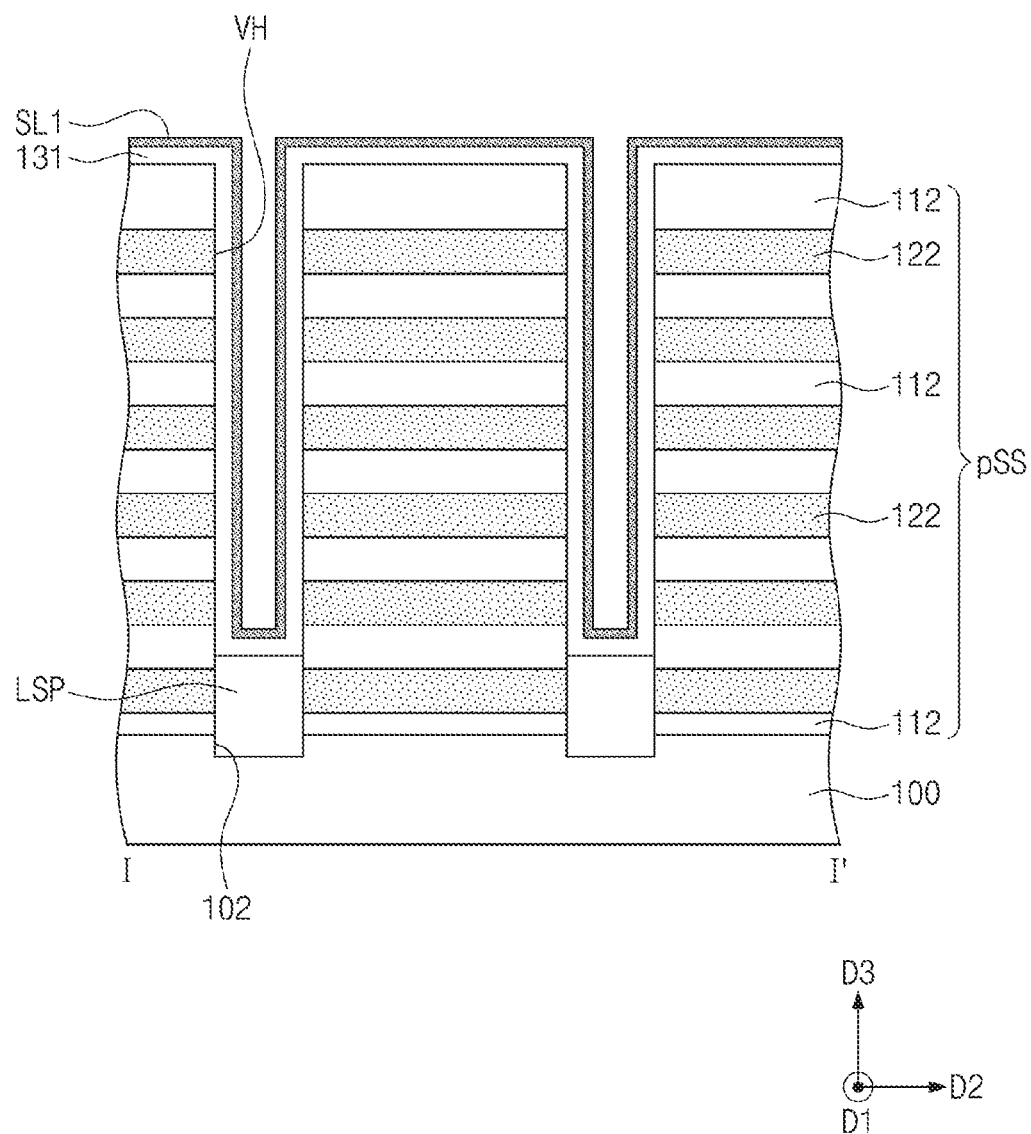
Figure 4E:
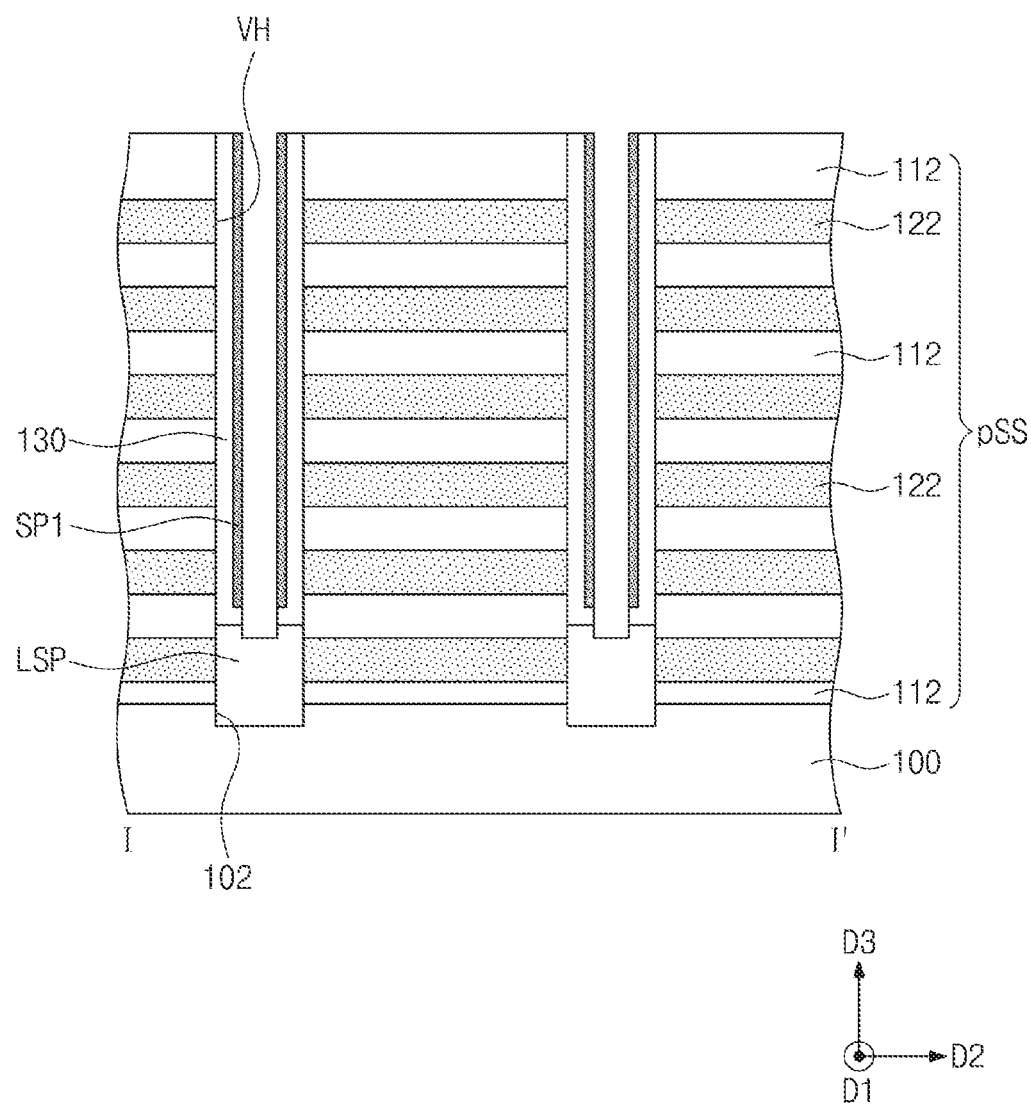
Figure 4F:
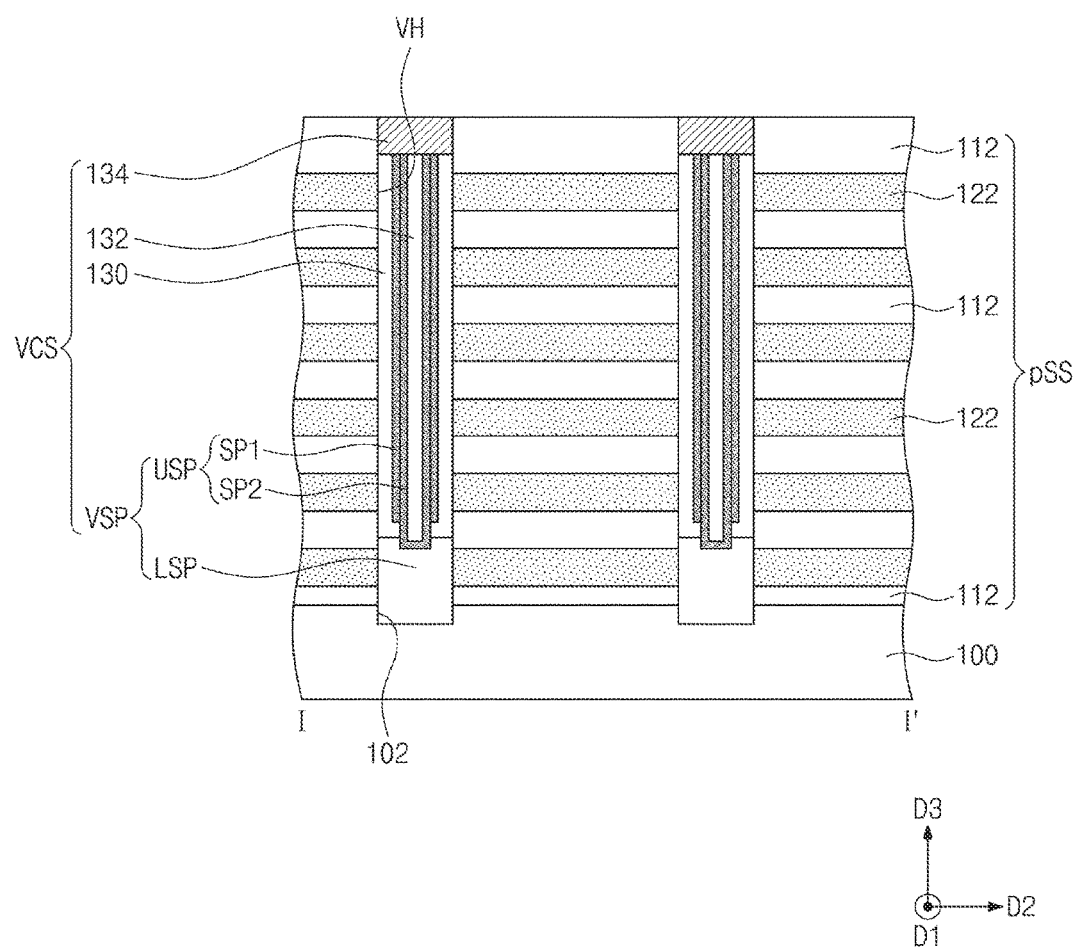
Figure 4G:
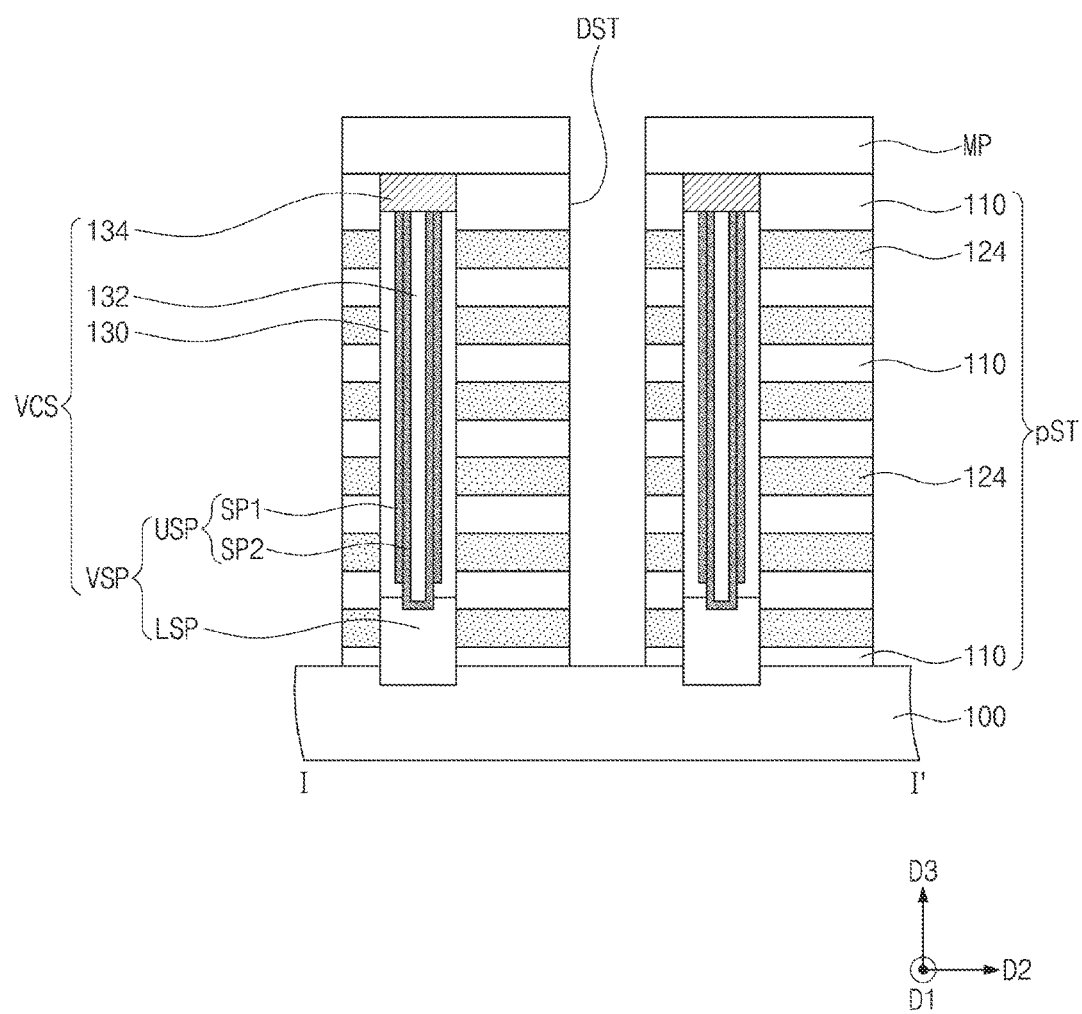
Figure 4H:
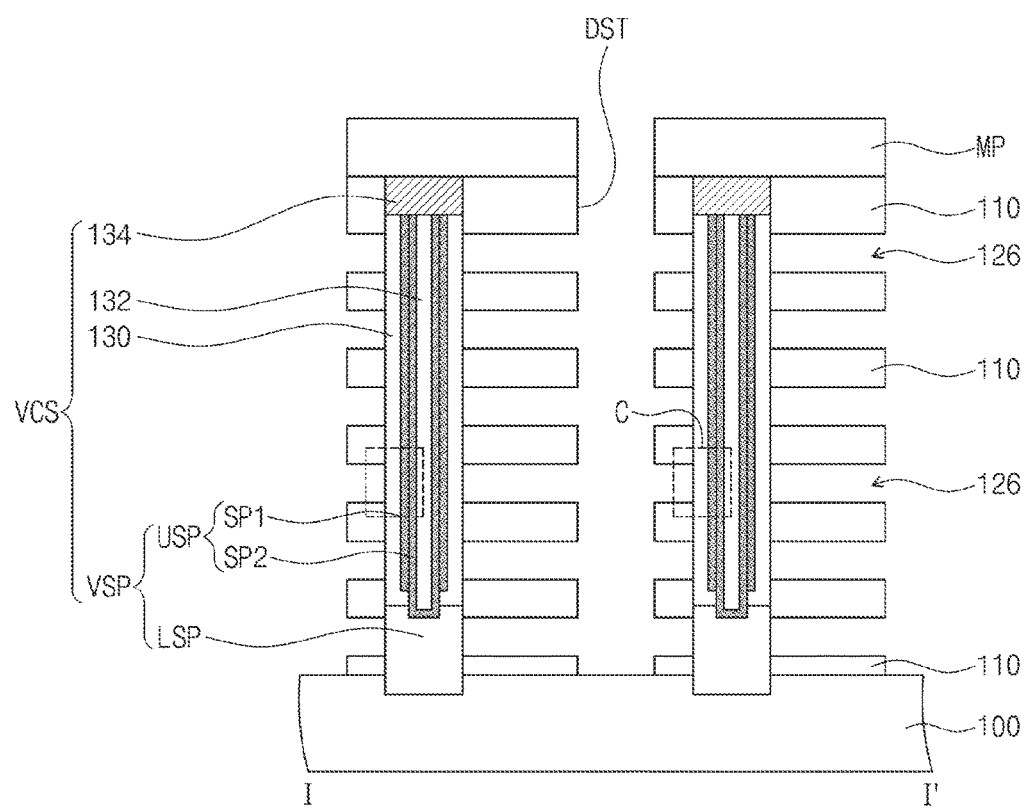
Figure 4H:
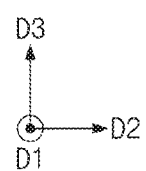
Figure 4I:
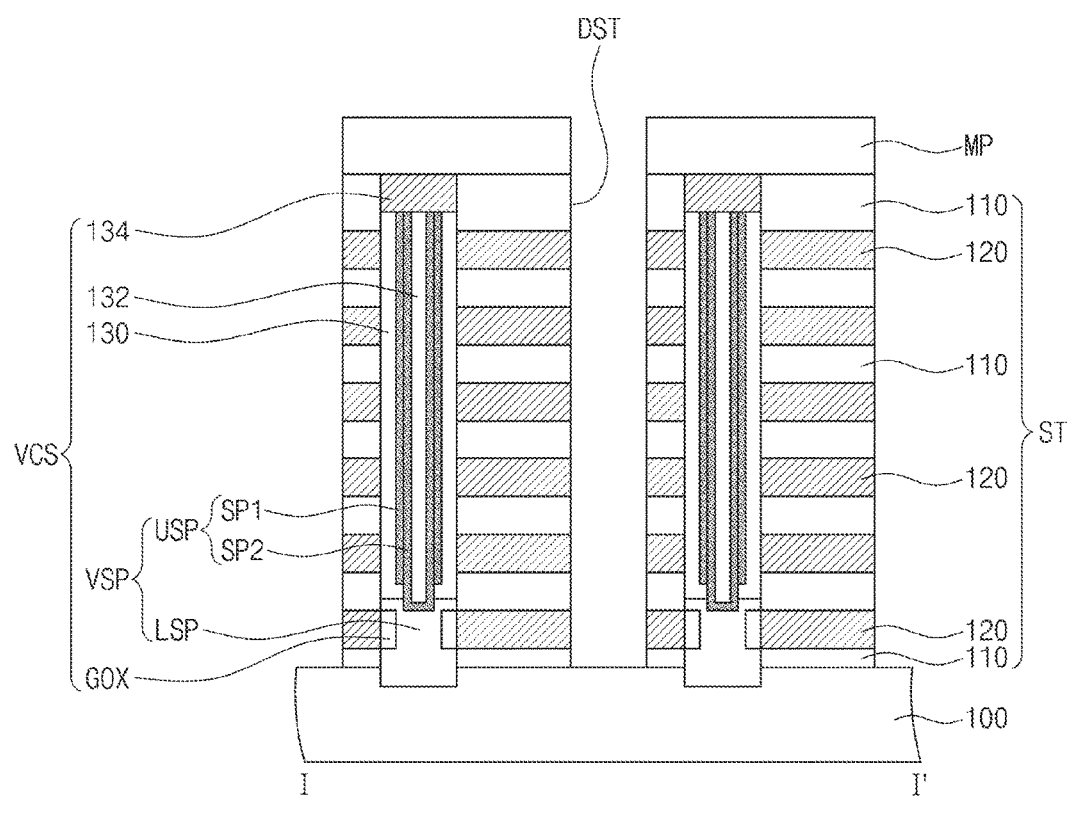
Figure 4I:
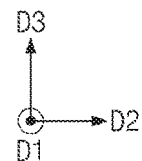
Figure 4J:
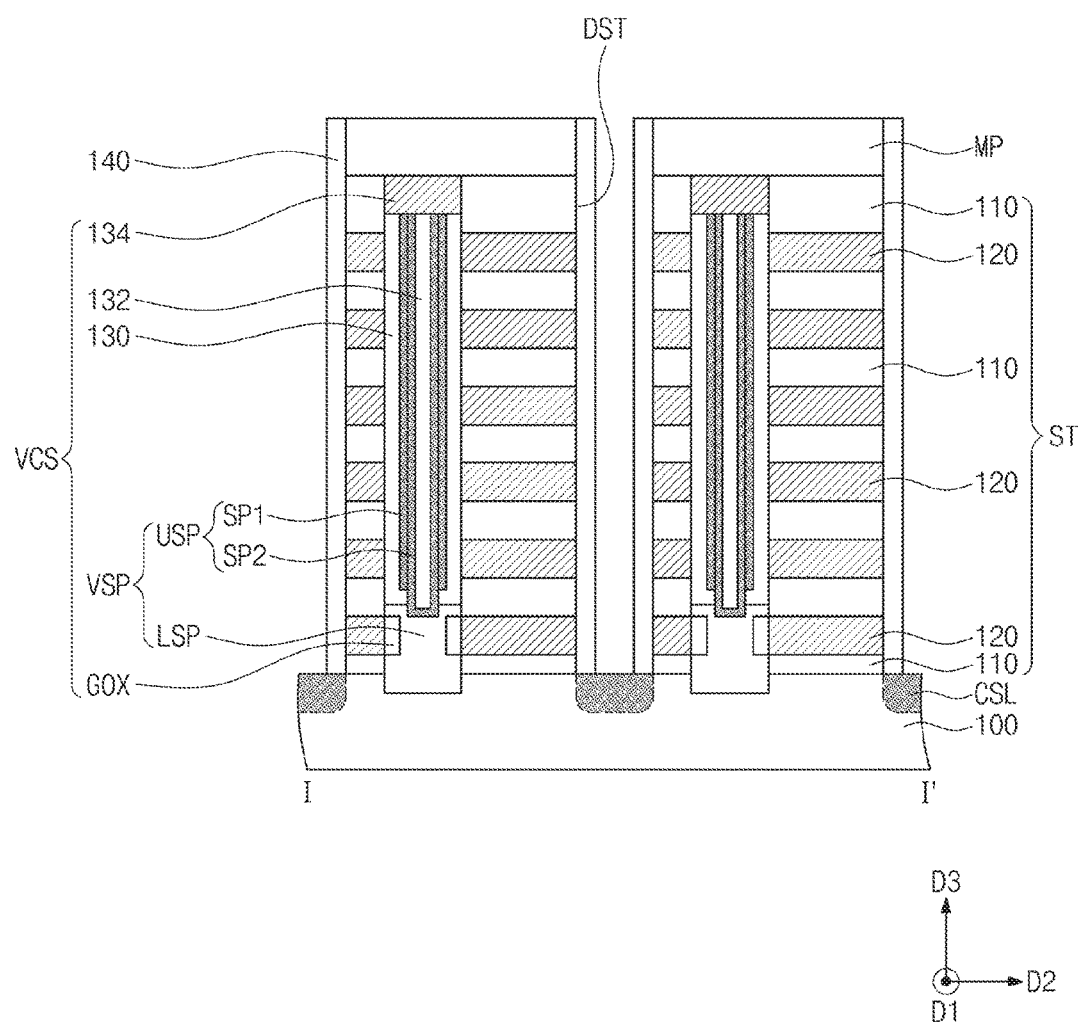
Figure 4K:
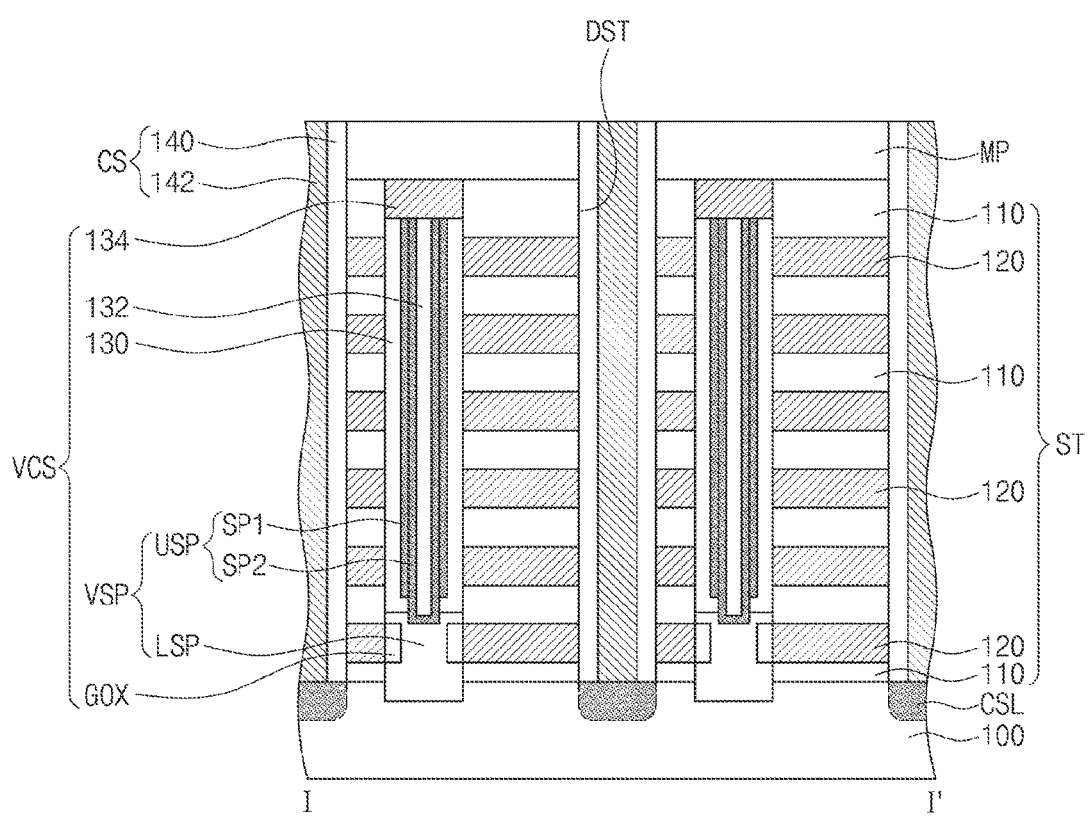
Figure 4K:
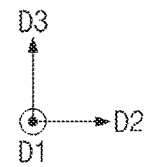
Figure 4L:
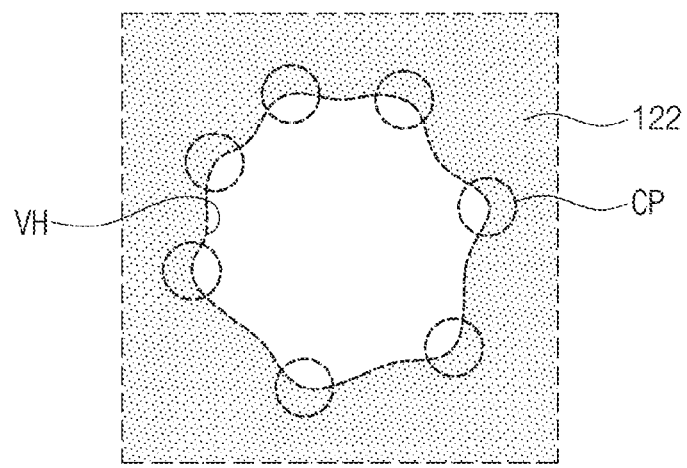
FIG. 4L is a plan view taken along line II-II' of FIG. 4B.

Referring to FIGS. 2A, 4B and 4L, vertical holes VH may be formed to penetrate the insulation layers 112 and the sacrificial layers 122, and thus the substrate 100 may be partially exposed by the vertical holes VH. The structure including the vertical holes VH formed in the insulation layer 112 and the sacrificial layers may be referred to as a first preliminary stack structure. The formation of the vertical holes VH may include performing an anisotropic etching process. The anisotropic etching process may partially etch the substrate 100 to form a recess region 102 at a top surface of the substrate 100.

The vertical hole VH may have a planar shape, which may be changed depending on a level (e.g., a height from the top surface of the substrate 100) of the vertical hole VH. The vertical hole VH may be formed into a desired planar shape (e.g., a circular shape) with increasing the level of the vertical hole VH, and may be warped or distorted away from the desired planar shape with decreasing the level of the vertical hole VH. As shown in FIG. 4L, at least a portion of the vertical hole VH may have a planar shape including at least one concave portion CP. In other words, at least a portion of an inner wall of the vertical hole VH may include at least one concave portion CP. The inner wall of the vertical hole VH may protrude more outward at the concave portion CP than at other portions.

Referring to FIGS. 2A and 4C, a lower semiconductor pattern LSP may be formed to fill a lower portion of each of the vertical holes VH. The formation of the lower semiconductor pattern LSP may include performing a selective epitaxial growth process in which the substrate 100 exposed by the vertical hole VH is used as a seed. The lower semiconductor pattern LSP may fill the recess region 102 and protrude from the top surface of the substrate 100. The lower semiconductor pattern LSP may have a top surface positioned between a top surface of a lowermost sacrificial layer 122 and a bottom surface of a next-overlying sacrificial layer 122. The lower semiconductor pattern LSP may include silicon or silicon-germanium.

A data storage layer 131 may be formed to conformally cover the inner wall of the vertical hole VH and the top surface of the lower semiconductor pattern LSP. The data storage layer 131 may extend onto a top surface of the uppermost insulation layer 112.

The formation of the data storage layer 131 may include sequentially forming a preliminary blocking insulation layer, a preliminary charge storage layer, and a preliminary tunnel insulation layer. The formation of the preliminary blocking insulation layer may include forming first and second preliminary sub-blocking layers. The formation of the first preliminary sub-blocking layer may include forming an oxidation target layer and oxidizing the oxidation target layer. It will be hereinafter described a method of forming the data storage layer 131 according to some example embodiments of inventive concepts with reference to FIGS. 5A to 12C.

FIGS. 5A to 5D are enlarged plan views of section B shown in FIG. 4C, illustrating a method of forming a data storage layer according to some example embodiments of inventive concepts. FIGS. 6A to 6D are plan views corresponding to line II-IF of FIG. 4C, illustrating a method of forming a data storage layer according to some example embodiments of inventive concepts.

Figure 5A:
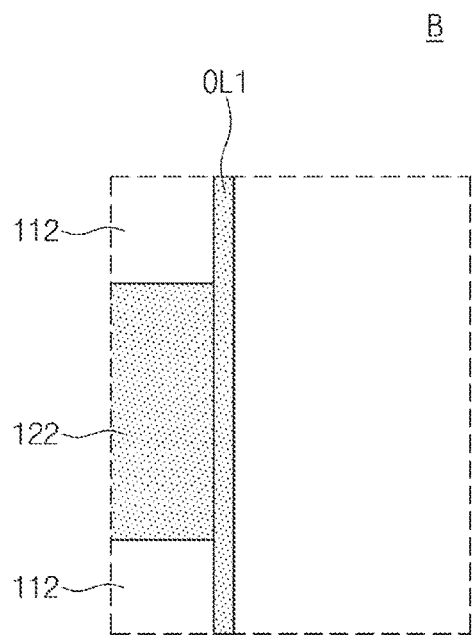
FIGS. 5A to 5D are enlarged views of section B shown in FIG. 4C, illustrating a method of forming a data storage layer according to some example embodiments of inventive concepts.
Figure 6A:
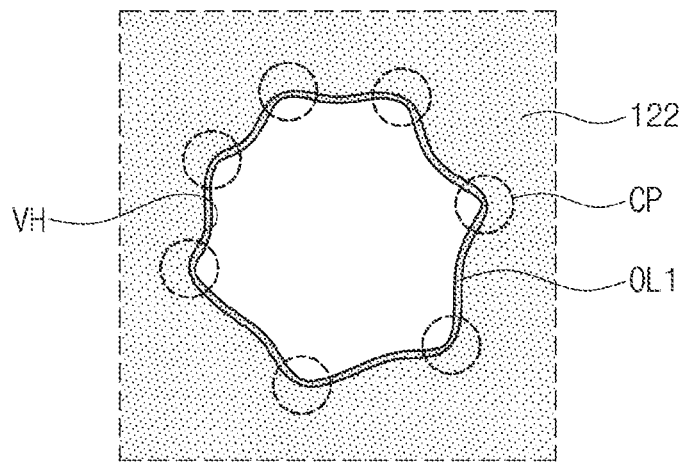
FIGS. 6A to 6D are plan views corresponding to line II-IF of FIG. 4C, illustrating a method of forming a data storage layer according to some example embodiments of inventive concepts.

Referring to FIGS. 4C, 5A and 6A, a first oxidation target layer OL1 may be formed. The first oxidation target layer OL1 may conformally cover the inner wall of the vertical hole VH. The first oxidation target layer OL1 may have a thickness in the range from about 10 Å to about 30 Å. The first oxidation target layer OL1 may include silicon and/or silicon nitride. For example, an atomic layer deposition (ALD) process may be employed to form the first oxidation target layer OL1.

Figure 5B:
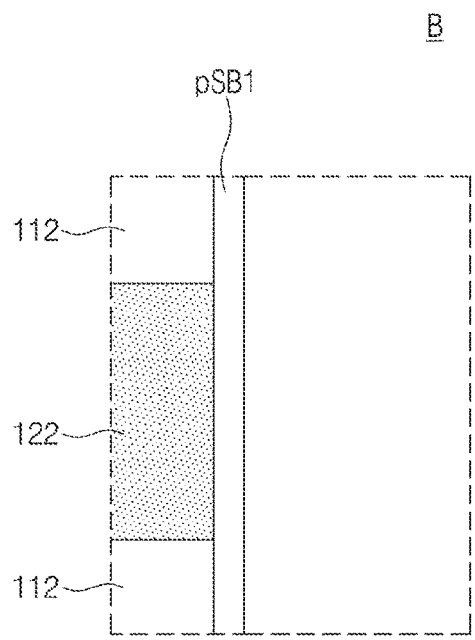
Figure 6B:
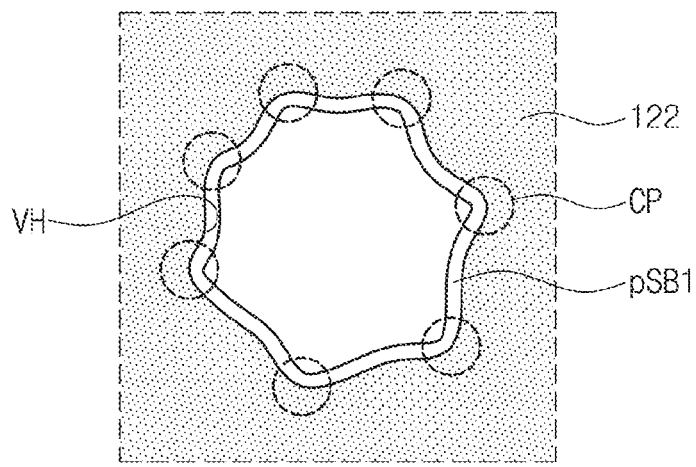

Referring to FIGS. 4C, 5B and 6B, an oxidation process may be performed to oxidize the first oxidation target layer OL1, so that a first preliminary sub-blocking layer pSB1 may be formed. The first preliminary sub-blocking layer pSB1 may thus include silicon oxide formed by the oxidation process.

Figure 5C:
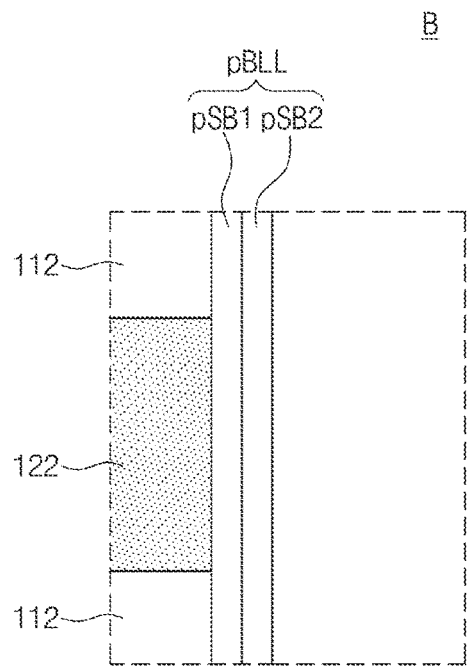
Figure 6C:
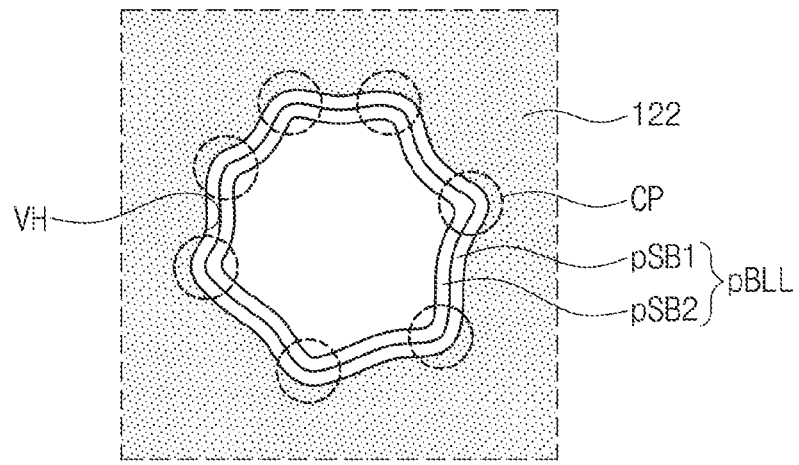

Referring to FIGS. 4C, 5C and 6C, a second preliminary sub-blocking layer pSB2 may be formed. The second preliminary sub-blocking layer pSB2 may be formed using, for example, an atomic layer deposition (ALD) process. In this case, the second preliminary sub-blocking layer pSB2 may include silicon oxide formed by the deposition process.

In some example embodiments, as shown in FIGS. 5C and 6C, only one second preliminary sub-blocking layer pSB2 may be formed. Inventive concepts, however, is not limited thereto. In other example embodiments, unlike those shown in FIGS. 5C and 6C, a plurality of the second preliminary sub-blocking layers pSB2 may be formed.

A preliminary blocking insulation layer pBLL may thus be formed to include the first and second preliminary sub-blocking layers pSB1 and pSB2.

Figure 5D:
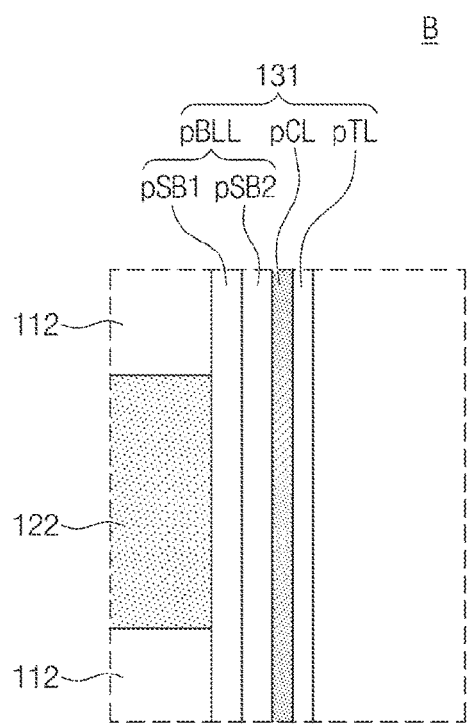
Figure 6D:
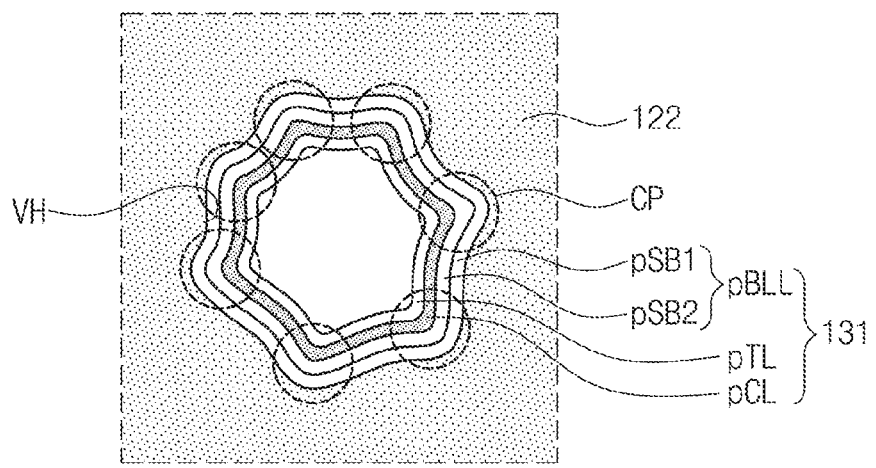

Referring to FIGS. 4C, 5D and 6D, a preliminary charge storage layer pCL and a preliminary tunnel insulation layer pTL may be sequentially formed. The formation of the data storage layer 131 may therefore be terminated. For example, an atomic layer deposition (ALD) process may be employed to sequentially form the preliminary charge storage layer pCL and the preliminary tunnel insulation layer pTL.

Figure 7A:
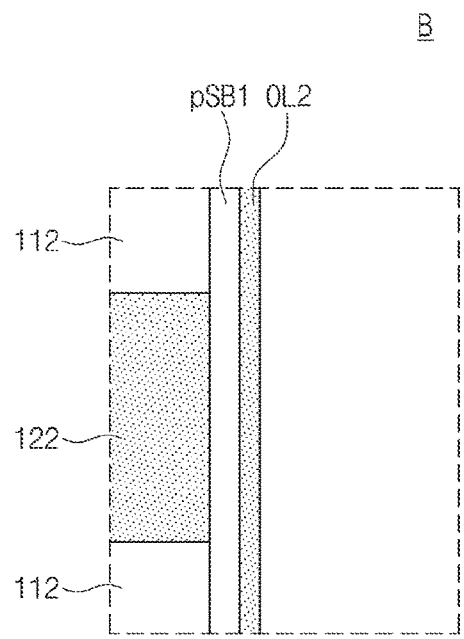
FIGS. 7A to 7C are enlarged views of section B shown in FIG. 4C, illustrating a method of forming a data storage layer according to some example embodiments of inventive concepts.
Figure 7B:
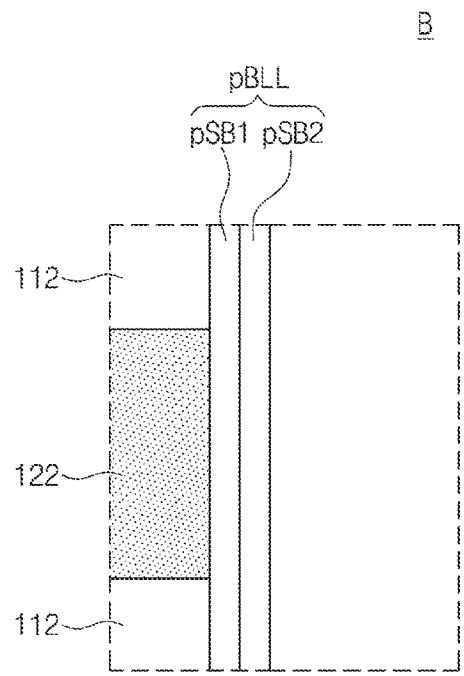
Figure 7C:
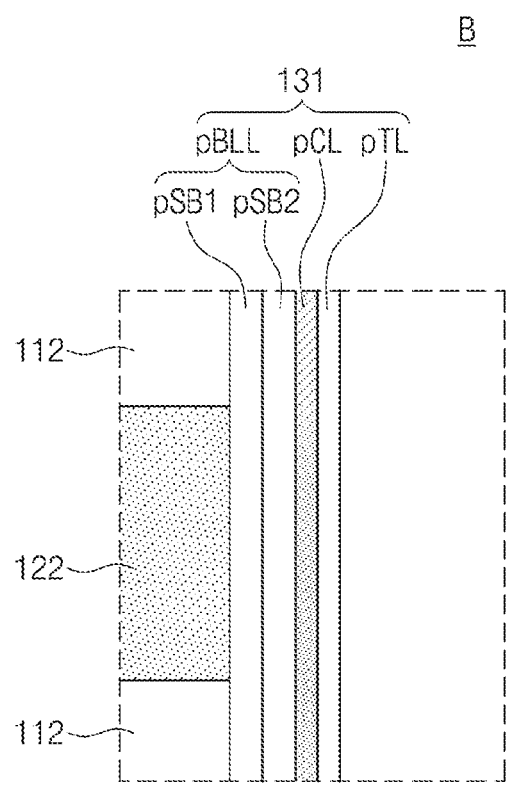
Figure 8A:
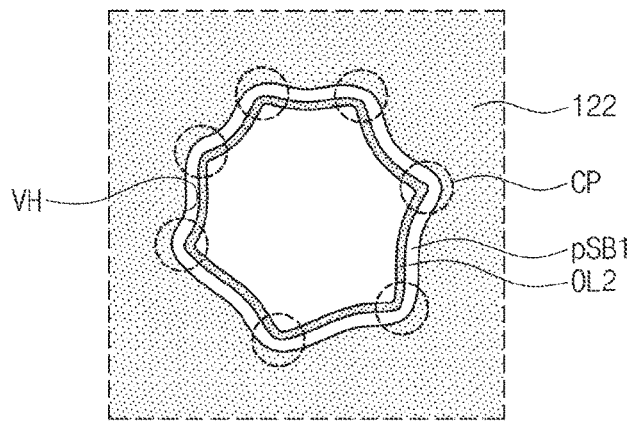
FIGS. 8A to 8C are plan views corresponding to line II-IF of FIG. 4C, illustrating a method of forming a data storage layer according to some example embodiments of inventive concepts.
Figure 8B:
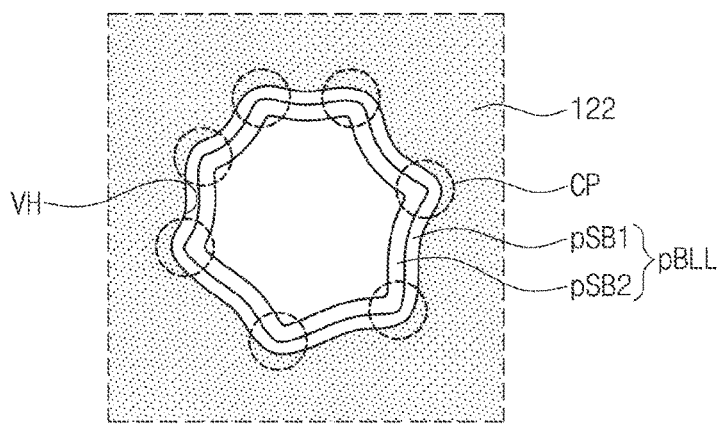
Figure 8C:
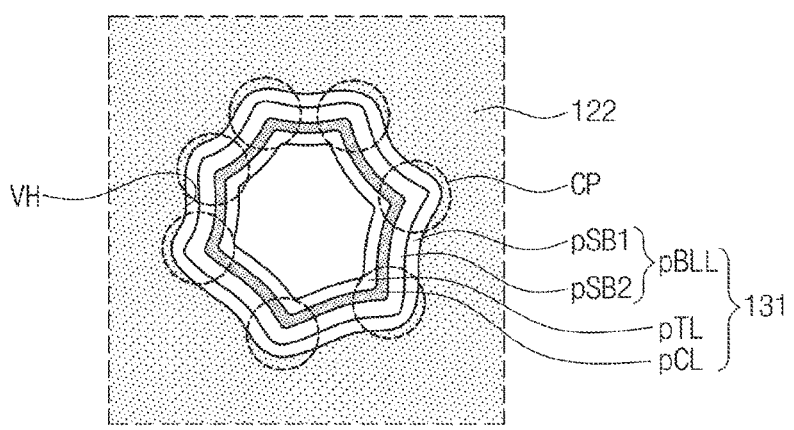

FIGS. 7A to 7C are enlarged views of section B shown in FIG. 4C, illustrating a method of forming a data storage layer according to some example embodiments of inventive concepts. FIGS. 8A to 8C are plan views corresponding to line II-II' of FIG. 4C, illustrating a method of forming a data storage layer according to some example embodiments of inventive concepts.

Referring to FIGS. 4C, 7A and 8A, a first preliminary sub-blocking layer pSB1 may be formed by the same method as that discussed with reference to FIGS. 5A, 5B, 6A, and 6B.

A second oxidation target layer OL2 may be formed on the first preliminary sub-blocking layer pSB1. The second oxidation target layer OL2 may have a thickness in the range from about 10 Å to about 30 Å. The second oxidation target layer OL2 may include silicon and/or silicon nitride. For example, an atomic layer deposition (ALD) process may be employed to form the second oxidation target layer OL2.

Referring to FIGS. 4C, 7B and 8B, an oxidation process may be performed to oxidize the second oxidation target layer OL2, so that a second preliminary sub-blocking layer pSB2 may be formed. In this case, the second preliminary sub-blocking layer pSB2 may include silicon oxide formed by the oxidation process.

In some example embodiments, as shown in FIGS. 7B and 8B, only one second preliminary sub-blocking layer pSB2 may be formed. Inventive concepts, however, is not limited thereto. In other example embodiments, unlike those shown in FIGS. 7B and 8B, a plurality of the second preliminary sub-blocking layers pSB2 may be formed.

A preliminary blocking insulation layer pBLL may thus be formed to include the first and second preliminary sub-blocking layers pSB1 and pSB2.

Referring to FIGS. 4C, 7C and 8C, a preliminary charge storage layer pCL and a preliminary tunnel insulation layer pTL may be sequentially formed. The formation of the data storage layer 131 may therefore be terminated.

FIGS. 9A to 9E are enlarged views of section B shown in FIG. 4C, illustrating a method of forming a data storage layer according to some example embodiments of inventive concepts. FIGS. 10A to 10E are plan views corresponding to line II-II' of FIG. 4C, illustrating a method of forming a data storage layer according to some example embodiments of inventive concepts.

Figure 9A:
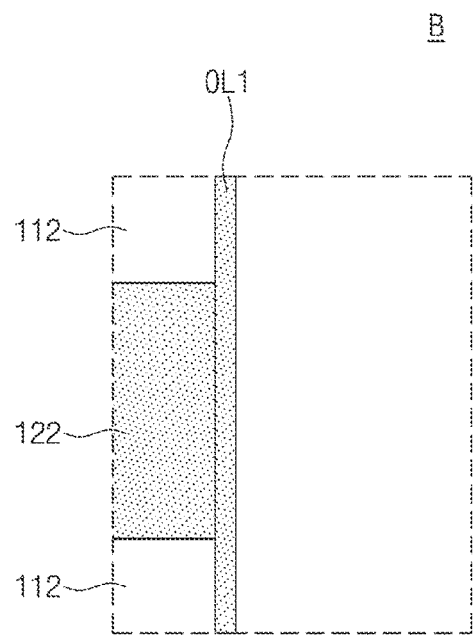
FIGS. 9A to 9E are enlarged views of section B shown in FIG. 4C, illustrating a method of forming a data storage layer according to some example embodiments of inventive concepts.
Figure 10A:
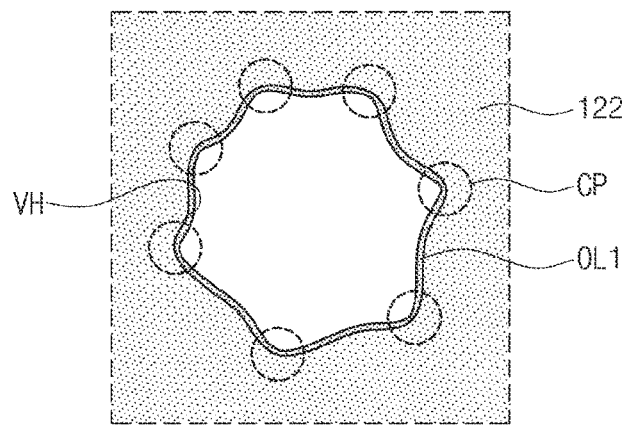
FIGS. 10A to 10E are plan views corresponding to line II-IF of FIG. 4C, illustrating a method of forming a data storage layer according to some example embodiments of inventive concepts.

Referring to FIGS. 4C, 9A and 10A, a first oxidation target layer OL1 may be formed. The first oxidation target layer OL1 may have a thickness in the range from about 10 Å to about 30 Å. The first oxidation target layer OL1 may include silicon and/or silicon nitride. For example, an atomic layer deposition (ALD) process may be employed to form the first oxidation target layer OL1.

Figure 9B:
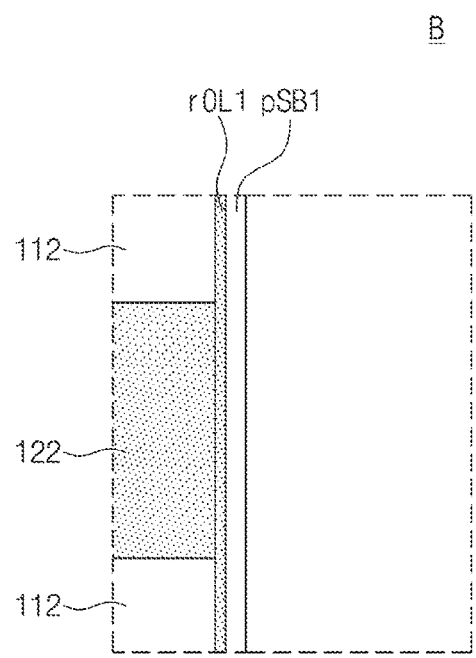
Figure 10B:
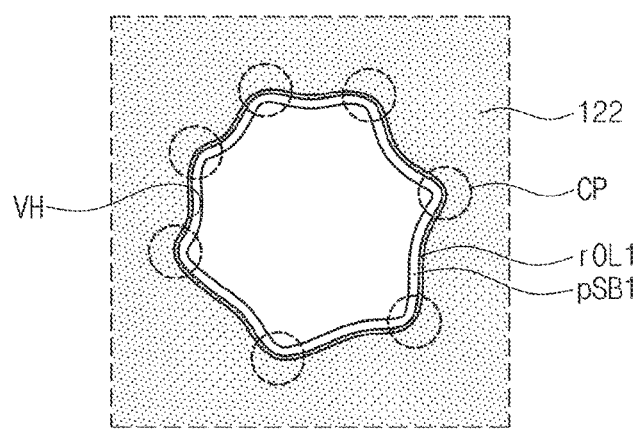

Referring to FIGS. 4C, 9B and 10B, an oxidation process may be performed to oxidize the first oxidation target layer OL1, so that a first preliminary sub-blocking layer pSB1 may be formed. A portion rOL1 of the first oxidation target layer OL1 may remain without being oxidized by the oxidation process.

Figure 9C:
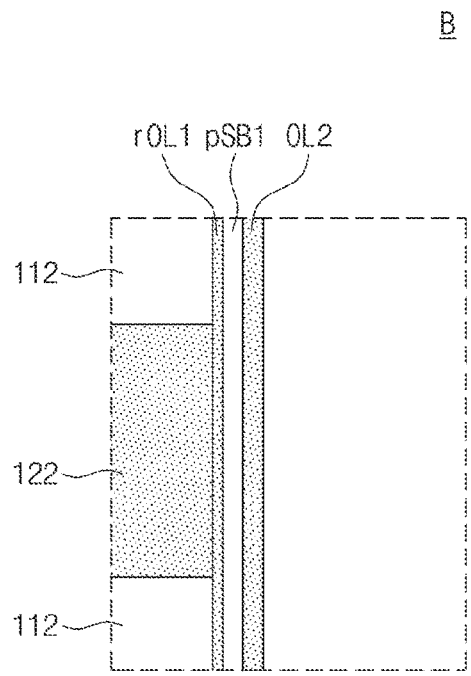
Figure 10C:
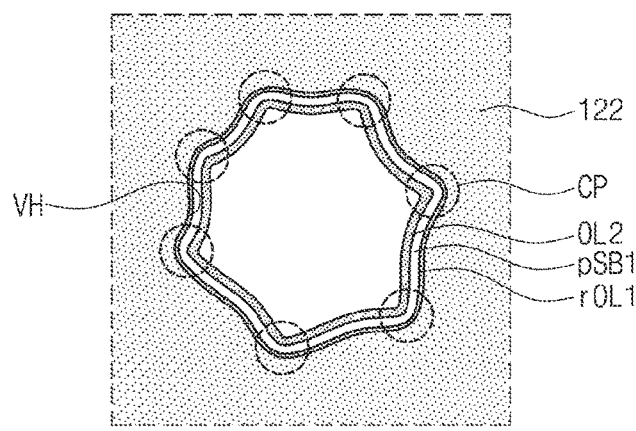

Referring to FIGS. 4C, 9C and 10C, a second oxidation target layer OL2 may be formed on the first preliminary sub-blocking layer pSB1. The second oxidation target layer OL2 may have a thickness in the range from about 10 Å to about 30 Å. The second oxidation target layer OL2 may include silicon and/or silicon nitride. For example, an atomic layer deposition (ALD) process may be employed to form the second oxidation target layer OL2.

Figure 9D:
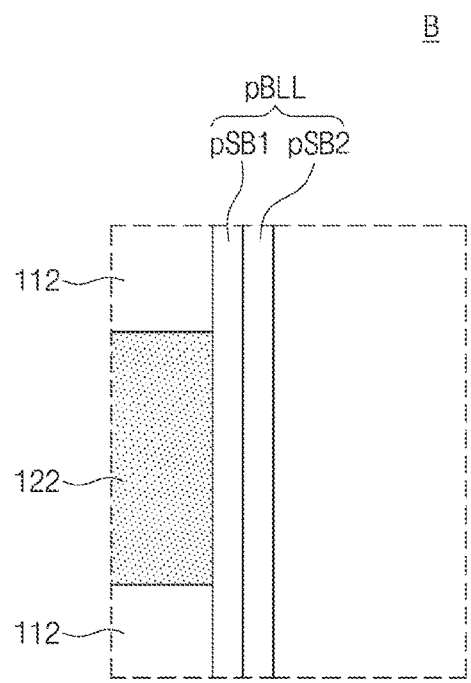
Figure 10D:
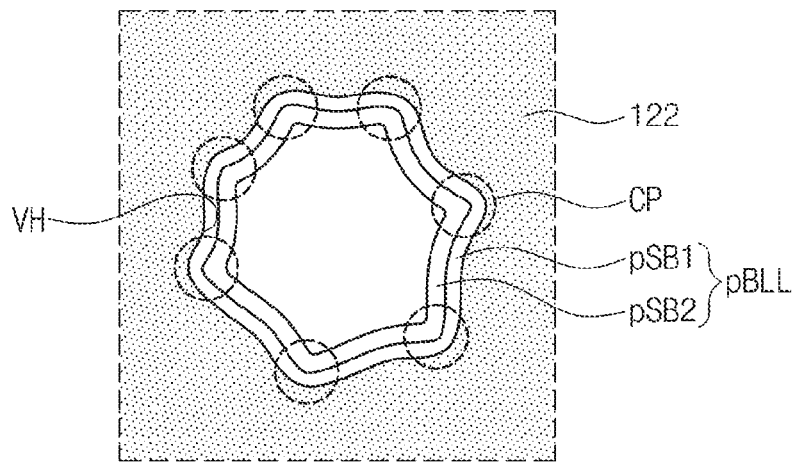

Referring to FIGS. 4C, 9D and 10D, an oxidation process may be performed to oxidize the second oxidation target layer OL2, so that a second preliminary sub-blocking layer pSB2 may be formed. The remaining portion rOL1 of the first oxidation target layer OL1 may be oxidized during the oxidation process and may be included in the first preliminary sub-blocking layer pSB1.

In some example embodiments, as shown in FIGS. 9D and 10D, only one second preliminary sub-blocking layer pSB2 may be formed. Inventive concepts, however, is not limited thereto. In other example embodiments, unlike those shown in FIGS. 9D and 10D, a plurality of the second preliminary sub-blocking layers pSB2 may be formed.

A preliminary blocking insulation layer pBLL may thus be formed to include the first and second preliminary sub-blocking layers pSB1 and pSB2.

Figure 9E:
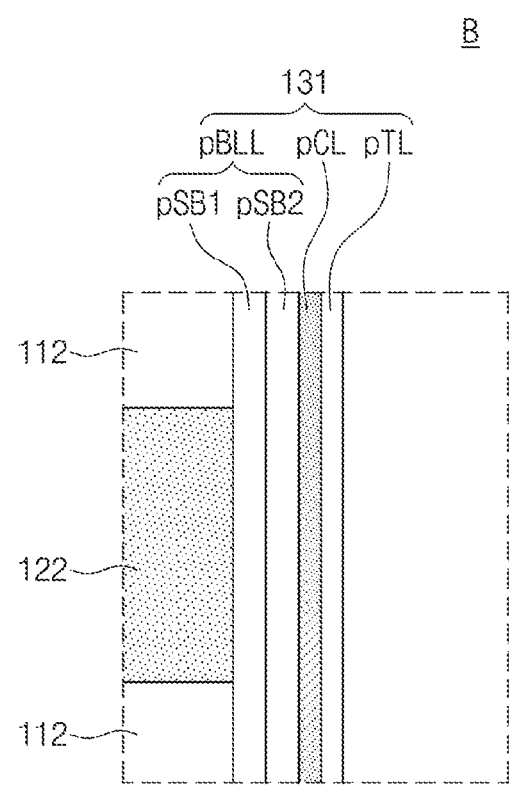
Figure 10E:
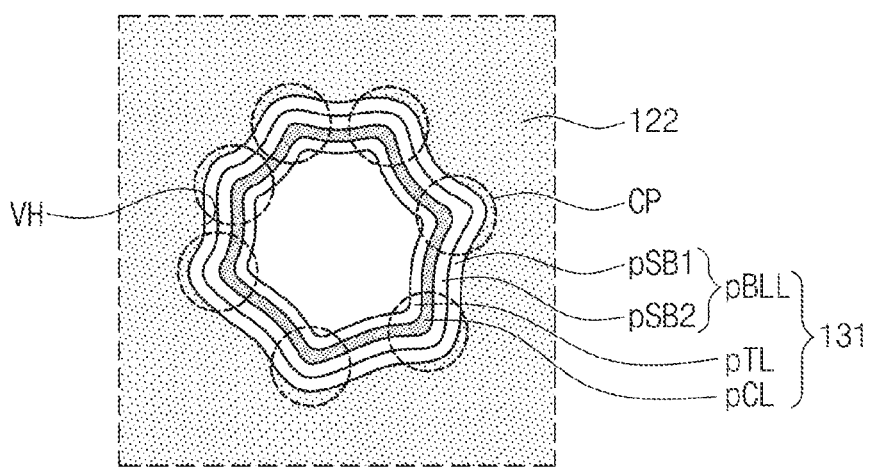

Referring to FIGS. 4C, 9E and 10E, a preliminary charge storage layer pCL and a preliminary tunnel insulation layer pTL may be sequentially formed. The formation of the data storage layer 131 may therefore be terminated.

Figure 11A:
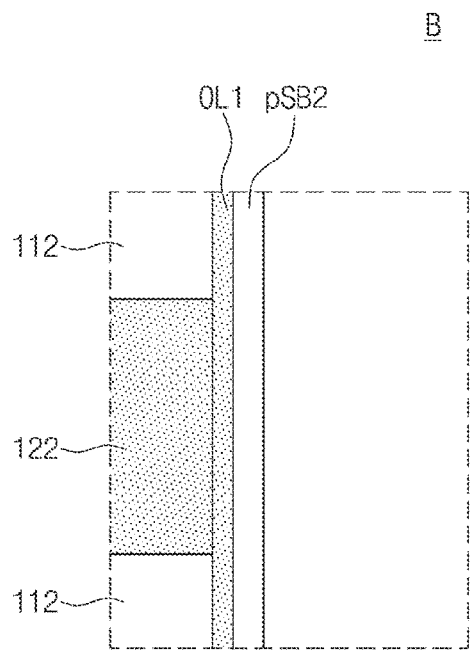
FIGS. 11A to 11C are enlarged views of section B shown in FIG. 4C, illustrating a method of forming a data storage layer according to some example embodiments of inventive concepts.
Figure 11B:
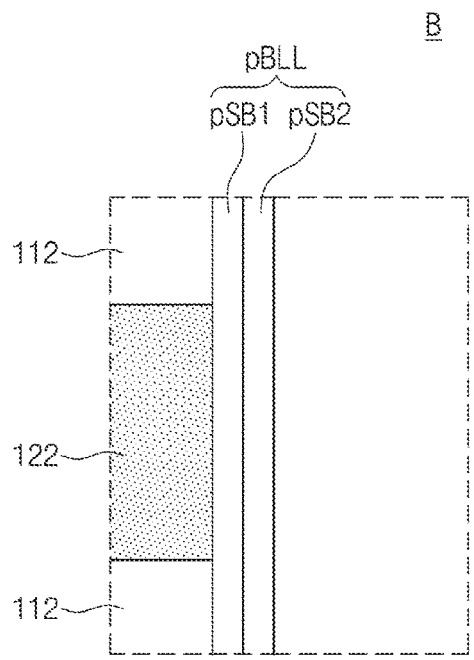
Figure 11C:
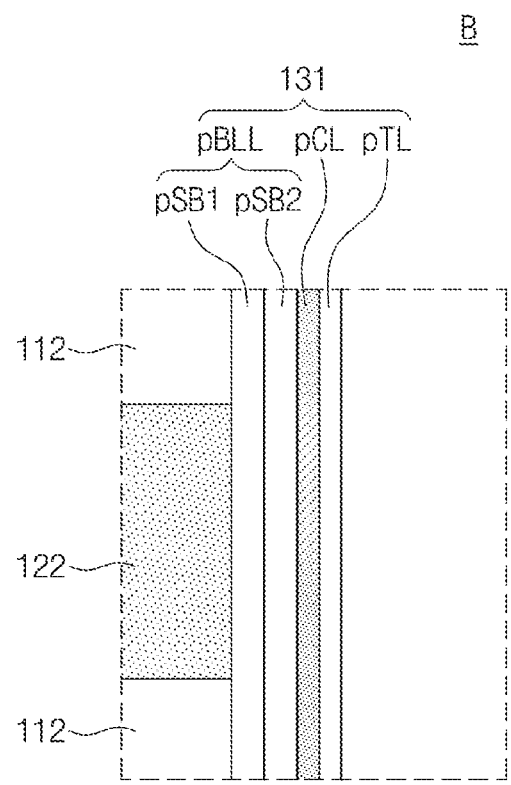
Figure 12A:
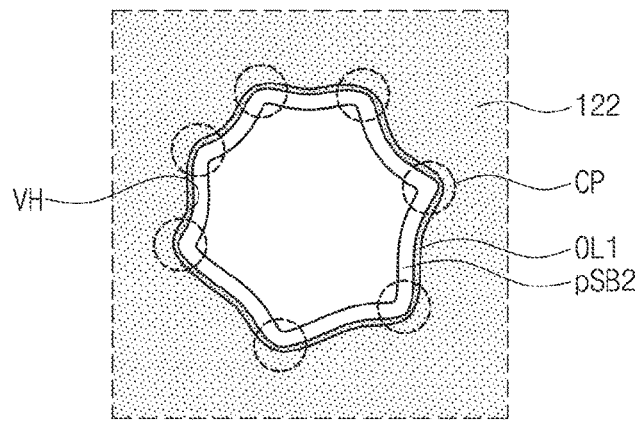
FIGS. 12A to 12C are plan views corresponding to line II-IF of FIG. 4C, illustrating a method of forming a data storage layer according to some example embodiments of inventive concepts.
Figure 12B:
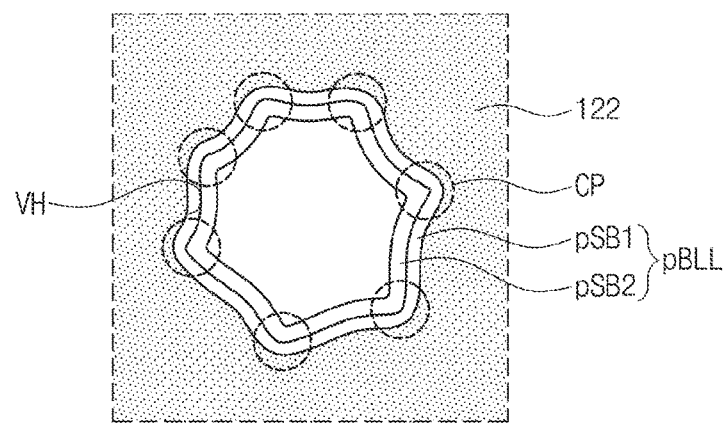
Figure 12C:
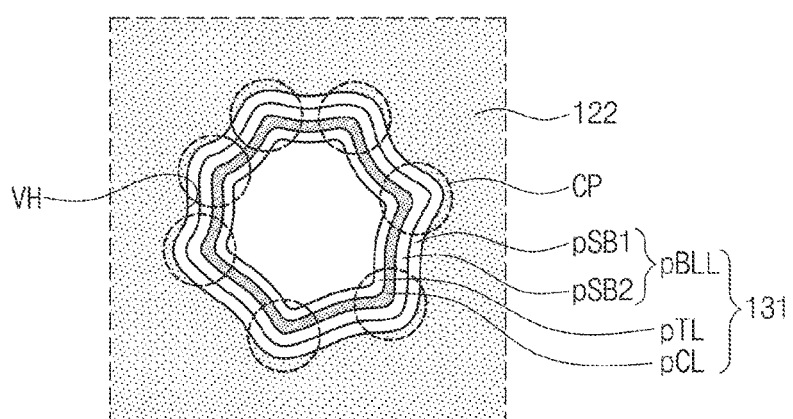

FIGS. 11A to 11C are enlarged views of section B shown in FIG. 4C, illustrating a method of forming a data storage layer according to some example embodiments of inventive concepts. FIGS. 12A to 12C are plan views corresponding to line II-II' of FIG. 4C, illustrating a method of forming a data storage layer according to some example embodiments of inventive concepts.

Referring to FIGS. 4C, 11A and 12A, a first oxidation target layer OL1 may be formed. The first oxidation target layer OL1 may have a thickness in the range from about 10 Å to about 30 Å. The first oxidation target layer OL1 may include silicon and/or silicon nitride. For example, an atomic layer deposition (ALD) process may be performed to form the first oxidation target layer OL1.

A second preliminary sub-blocking layer pSB2 may be formed on the first oxidation target layer OL1. For example, an atomic layer deposition (ALD) process may be employed to form the second preliminary sub-blocking layer pSB2. In this case, the second preliminary sub-blocking layer pSB2 may include silicon oxide formed by the deposition process.

Referring to FIGS. 4C, 11B and 12B, an oxidation process may be performed to oxidize the first oxidation target layer OL1, so that a first preliminary sub-blocking layer pSB1 may be formed. Accordingly, the first preliminary sub-blocking layer pSB1 may include silicon oxide formed by the oxidation process.

In some example embodiments, as shown in FIGS. 11B and 12B, only one second sub-blocking layer pSB2 may be formed. Inventive concepts, however, is not limited thereto. In other example embodiments, unlike those shown in FIGS. 11B and 12B, a plurality of the second preliminary sub-blocking layers pSB2 may be formed.

A preliminary blocking insulation layer pBLL may thus be formed to include the first and second preliminary sub-blocking layers pSB1 and pSB2.

Referring to FIGS. 4C, 11C and 12C, a preliminary charge storage layer pCL and a preliminary tunnel insulation layer pTL may be sequentially formed. The formation of the data storage layer 131 may therefore be terminated.

As not shown in figures, in each of the embodiments discussed above, the formation of the preliminary blocking insulation layer pBLL may further include forming additional second preliminary sub-blocking layers. The additional second preliminary sub-blocking layers may be formed by depositing and oxidizing an oxidation target layer or by directly depositing a silicon oxide layer.

When at least one of the first and second preliminary sub-blocking layers pSB1 and pSB2 is formed by forming and oxidizing an oxidation target layer including silicon nitride, a very small amount (e.g., equal to or less than about 0.1 at %) of nitrogen may further be included in the at least one of the first and second preliminary sub-blocking layers pSB1 and pSB2.

According to some example embodiments of inventive concepts, the first preliminary sub-blocking layer pSB1 may include silicon oxide formed by an oxidation process. Silicon oxide formed by an oxidation process may have a microstructure finer than that of silicon oxide formed by a deposition process, and thus may have high resistance to an etching process. The first preliminary sub-blocking layer pSB1 (or the first sub-blocking layer SB1 formed therefrom) may therefore have high etching resistance in a subsequent etching process. This will be further discussed with reference to FIG. 4H.

In case that an oxidation layer is formed by forming and oxidizing an oxidation target layer on a surface having a concave portion, the oxidation layer may have a relatively smaller thickness on the concave portion than on other portions. For this reason, the oxidation layer may have a non-uniform thickness. This may be because a portion of the oxidation target layer formed on the concave portion suffers from stress concentration due to volumetric expansion generated by oxidation of the oxidation target layer and/or receives an insufficient supply of an oxidizer during an oxidation process on the oxidation target layer. A thickness non-uniformity of the oxidation layer may increase with a thickness of the oxidation target layer.

According to some example embodiments of inventive concepts, the formation of the preliminary blocking insulation layer pBLL may include performing individual processes for separately forming the first and second preliminary sub-blocking layers pSB1 and pSB2 that have a relatively small thickness. Even though the first preliminary sub-blocking layer pSB1 is formed by forming and oxidizing the first oxidation target layer OL1, the first oxidation target layer OL1 may have a relatively small thickness. Accordingly, the preliminary blocking insulation layer pBLL may have reduced thickness non-uniformity produced by the above mentioned reason. Likewise, even though the second preliminary sub-blocking layer pSB2 is formed by forming and oxidizing the second oxidation target layer OL2, the second oxidation target layer OL2 may have a relatively small thickness. Accordingly, the preliminary blocking insulation layer pBLL may have reduced thickness non-uniformity generated by the above mentioned reason. In conclusion, according to some example embodiments of inventive concepts, it may be possible to improve an electrical property distribution due to the thickness non-uniformity of the preliminary blocking insulation layer pBLL.

Referring to FIGS. 2A and 4D, a first semiconductor layer SL1 may be formed to conformally cover the data storage layer 131. The first semiconductor layer SL1 may cover the data storage layer 131 in the vertical holes VH and extend onto the top surface of the uppermost insulation layer 112. The first semiconductor layer SL1 may be formed using, for example, a chemical vapor deposition (CVD) process or an atomic layer deposition (ALD) process.

Referring to FIGS. 2A and 4E, a data storage structure 130 and a first semiconductor pattern SP1 may be formed. The formation of the data storage structure 130 and the first semiconductor pattern SP1 may include performing an anisotropic etching process on the data storage layer 131 and the first semiconductor layer SL1. The anisotropic etching process may be carried out until exposing the top surface of the uppermost insulation layer 112. The anisotropic etching process may reveal the lower semiconductor pattern LSP. Moreover, the anisotropic etching process may partially recess an upper portion of the lower semiconductor pattern LSP. The data storage structure 130 may include a blocking insulation layer (see BBL of FIG. 13A or 13B), a charge storage layer (see CL of FIG. 13A or 13B), and a tunnel insulation layer (see TL of FIG. 13A or 13B). The blocking insulation layer (see BLL of FIG. 13A or 13B) may include a first sub-blocking layer (see SB1 of FIG. 13A or 13B) and a second sub-blocking layer (see SB2 of FIG. 13A or 13B).

Referring to FIGS. 2A and 4F, a second semiconductor pattern SP2 and a buried insulator 132 may be formed. The formation of the second semiconductor pattern SP2 and the buried insulator 132 may include forming a second semiconductor layer (not shown) to conformally cover an entire surface of the substrate 100, forming a buried insulation layer (not shown) to fill the vertical holes VH, and performing a planarization process on the second semiconductor layer and the buried insulation layer. An upper semiconductor pattern USP may be defined to include the first semiconductor pattern SP1 and the second semiconductor pattern SP2, and a vertical semiconductor pattern VSP may be defined to include the upper semiconductor pattern USP and the lower semiconductor pattern LSP.

A partial recess region may be formed on the upper semiconductor pattern USP, the data storage structure 130, and the buried insulator 132. A conductive pad 134 may be formed in the recessed region. A vertical channel structure VCS may be defined to include the lower semiconductor pattern LSP, the upper semiconductor pattern USP, the data storage structure 130, the buried insulator 132, and the conductive pad 134.

Referring to FIGS. 2A and 4G, separation trenches DST may be formed to define second preliminary stack structures pST. The formation of the separation trenches DST may include forming mask patterns MP extending in a first direction D1 and spaced apart from each other in a second direction D2 intersecting the first direction D1 and successively patterning the insulation layers 112 and the sacrificial layers 122 using the mask patterns MP as an etching mask. The separation trenches DST may partially expose the top surface of the substrate 100.

Each of the second preliminary stack structures pST may include insulation patterns 110 and sacrificial patterns 124 that are alternately and repeatedly stacked. The separation trenches DST may make the second preliminary stack structures pST spaced apart from each other in the second direction D2. In a plan view, each of the second preliminary stack structures pST may extend in the first direction D1.

Figure 13A:
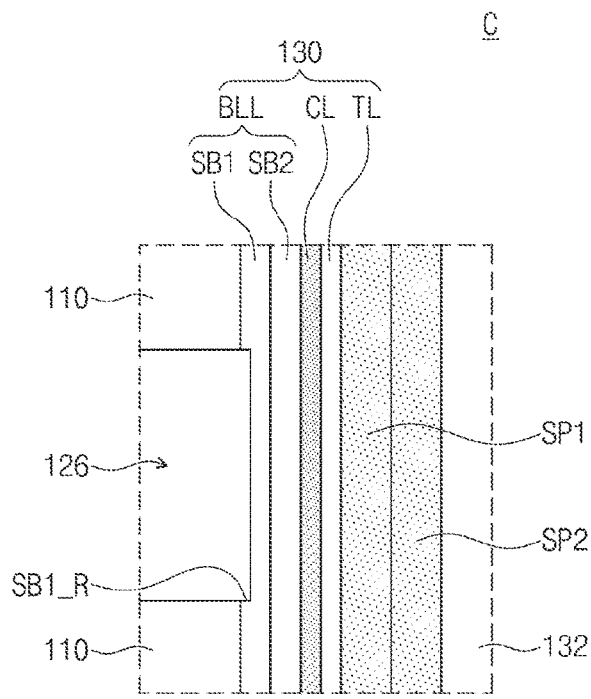
FIGS. 13A and 13B are enlarged views of section C shown in FIG. 4H.
Figure 13B:
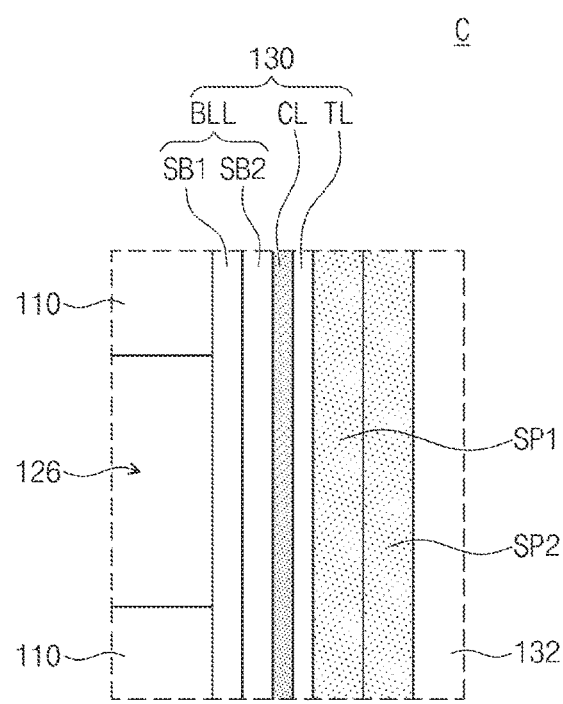

FIGS. 13A and 13B are enlarged views of section C shown in FIG. 4H. Referring to FIGS. 2A, 4H, 13A and 13B, a selective removal may be performed on the sacrificial patterns 124 exposed by the separation trenches DST such that gap regions 126 may be formed. The gap regions 126 may correspond to zones from which the sacrificial patterns 124 are removed. The gap regions 126 may be limited by the data storage structure 130 and the insulation patterns 110. The removal of the sacrificial patterns 124 may be performed by a wet etching process that uses an etching solution including phosphoric acid. The gap regions 126 may partially expose the data storage structure 130 and the lower semiconductor pattern LSP.

In some example embodiments, as shown in FIG. 13A, the wet etching process may partially etch the first sub-blocking layer SB1. Accordingly, the first sub-blocking layer SB1 may include laterally recessed regions SB1_R. Each of the gap regions 126 may include a corresponding one of the laterally recessed regions SB1_R. The laterally recessed regions SB1_R may have an insignificant depth. For example, each of the laterally recessed regions SB1_R may have a depth less than a thickness of the first sub-blocking layer SB1. In other example embodiments, as shown in FIG. 13B, the wet etching process may not substantially etch the first sub-blocking layer SB1.

As the first sub-blocking layer SB1 includes finely microstructured silicon oxide formed by an oxidation process, the wet etching process may not substantially etch or may slightly etch the first sub-blocking layer SB1, even if so.

In case that the wet etching process over-etches the blocking insulation layer BLL, there may occur a problem that charges passes through the blocking insulation layer BLL and comes out of the charge storage layer CL. In contrast, according to some example embodiments of inventive concepts, the aforementioned problem may be suppressed because the first sub-blocking layer SB1 may not be substantially etched or may be slightly etched, even if so.

Referring to FIGS. 2A and 4I, a gate dielectric layer GOX may be formed by thermally oxidizing portions of the lower semiconductor pattern LSP that are exposed by the gap regions 126.

The separation trenches DST may receive a conductive material to form a conductive layer (not shown) in the gap regions 126. A chemical vapor deposition (CVD) process may be performed to form the conductive layer. The conductive layer may include a metal such as, for example, tungsten (W), aluminum (Al), titanium (Ti), tantalum (Ta), cobalt (Co), or copper (Cu).

After that, a portion of the conductive layer may be removed from outside (e.g., in the separation trenches DST and on the mask patterns MP) of the gap regions 126. Hence, electrode patterns 120 may be formed in the gap regions 126. A portion of the conductive layer may be removed from the separation trenches DST, so that the substrate 100 may be exposed by the separation trenches DST. Stack structures ST may be defined to include the insulation patterns 110 and the electrode patterns 120.

Referring to FIGS. 2A and 4J, common source lines CSL may be formed in the substrate 100 exposed by the separations trenches DST. The common source lines CSL may be formed by implanting impurities into the substrate 100 exposed by the separation trenches DST.

Spacers 140 may be formed on opposite sidewalls of each of the separation trenches DST. The formation of the spacers 140 may include forming an insulation layer (not shown) to cover floor surfaces and sidewalls of the separation trenches DST and removing portions of the insulation layer that cover the floor surfaces of the separation trenches DST so as to expose the top surface of the substrate 100.

Referring to FIGS. 2A and 4K, common source contacts 142 may be formed to fill the separation trenches DST. The formation of the common source contacts 142 may include forming a conductive layer (not shown) to fill the separation trenches DST and performing a planarization process until exposing top surfaces of the mask patterns MP. Each of the separation trenches DST may be provided therein with a contact structure CS that includes a pair of the spacers 140 and the common source contact 142 therebetween.

Referring back to FIGS. 2A and 2B, an interlayer dielectric layer 150 may be formed on the stack structures ST. The interlayer dielectric layer 150 may cover top surfaces of the mask patterns MP, top surfaces of the spacers 140, and top surfaces of the common source contacts 142. The interlayer dielectric layer 150 may include, for example, silicon oxide, silicon nitride, and/or silicon oxynitride.

Contact plugs 160 may be provided to penetrate the interlayer dielectric layer 150 and the mask patterns MP. Each of the contact plugs 160 may be electrically connected to each of the conductive pads 134.

Bit lines BL may be formed on the interlayer dielectric layer 150. Each of the bit lines BL may extend in the second direction D2 while running across the stack structures ST.

Each of the bit lines BL may be connected through the contact plugs 160 to a plurality of the vertical channel structures VCS arranged in the second direction D2.

According to some example embodiments of inventive concepts, the first preliminary sub-blocking layer may include silicon oxide formed by an oxidation process. Silicon oxide formed by an oxidation process may have a microstructure finer than that of silicon oxide formed by a deposition process, and thus may have relatively great resistance to an etching process. It therefore may be possible to prevent the first sub-blocking layer (or the blocking insulation layer) from being over-etched caused by the removal of the sacrificial patterns.

According to some example embodiments of inventive concepts, the formation of the preliminary blocking insulation layer may include performing individual processes for separately forming the first and second preliminary sub-blocking layers that have a relatively small thickness. A relatively small thickness may be given to the first oxidation target layer for forming the first preliminary sub-blocking layer. Accordingly, even though the first preliminary sub-blocking layer is formed on the partly concaved inner sidewall of the vertical hole, the first preliminary sub-blocking layer may have reduced thickness non-uniformity.

Although some example embodiments of inventive concepts have been described, it will be understood by one of ordinary skill in the art that variations in form and detail may be made therein without departing from the spirit and scope of inventive concepts. The above disclosed embodiments should thus be considered illustrative and not restrictive.

What is claimed is:

1. A method of manufacturing a semiconductor device, the method comprising:
   forming insulation layers and sacrificial layers that are alternately and repeatedly stacked on top of each other on a substrate;
   forming a vertical hole that penetrates the insulation layers and the sacrificial layers; and
   forming a vertical channel structure in the vertical hole, the forming the vertical channel structure including forming a blocking insulation layer, a charge storage layer, a tunnel insulation layer, and a semiconductor pattern,
   the forming the blocking insulation layer including forming a first oxidation target layer, oxidizing the first oxidation target layer to form a first sub-blocking layer, and forming a second sub-blocking layer such that the first sub-blocking layer is between the second sub-blocking layer and an inner sidewall of the vertical hole.

2. The method of claim 1, wherein the forming the first oxidation target layer includes forming the first oxidation target layer to include silicon or silicon nitride.

3. The method of claim 2, wherein the forming the first sub-blocking layer includes forming the first sub-blocking layer to include silicon oxide based on oxidizing the silicon or silicon nitride included in the first oxidation target layer.

4. The method of claim 1, wherein the forming the second sub-blocking layer includes depositing silicon oxide on the substrate.

5. The method of claim 4, wherein the oxidizing the first oxidation target layer is performed after the forming the second sub-blocking layer.

6. The method of claim 1, wherein the forming the second sub-blocking layer includes:
   forming a second oxidation target layer; and
   oxidizing the second oxidation target layer.

7. The method of claim 6, wherein
   a remaining portion of the first oxidation target layer remains after oxidizing the first oxidation target layer, and
   the oxidizing the second oxidation target layer includes oxidizing the remaining portion of the first oxidation target layer during the oxidizing the second oxidation target layer.

8. The method of claim 1, wherein a microstructure of the first sub-blocking layer is finer than a microstructure of the second sub-blocking layer.

9. The method of claim 1, further comprising:
   removing the sacrificial layers to form gap regions, wherein
   the gap regions expose the first sub-blocking layer.

10. The method of claim 9, wherein the gap regions do not expose the second sub-blocking layer.

11. The method of claim 1, wherein the forming the first sub-blocking layer includes forming the first sub-blocking layer to extend along a direction perpendicular to a top surface of the substrate.

12. A method of manufacturing a semiconductor device, the method comprising:
   forming insulation layers and sacrificial layers that are alternately and repeatedly stacked on top of each other on a substrate;
   forming a vertical hole that penetrates the insulation layers and the sacrificial layers; and
   forming a vertical channel structure in the vertical hole, the forming the vertical channel structure including forming a first sub-blocking layer on an inner sidewall of the vertical hole, and forming a second sub-blocking layer on an inner sidewall of the first sub-blocking layer,
   the forming the first sub-blocking layer including forming a silicon nitride layer on the inner sidewall of the vertical hole, and oxidizing the silicon nitride layer.

13. The method of claim 12, wherein the forming the first sub-blocking layer includes forming the silicon nitride layer to contact the inner sidewall of the vertical hole.

14. The method of claim 12, wherein the forming the first sub-blocking layer includes forming the first sub-blocking layer to include nitrogen greater than 0.0 at % and less than or equal to about 0.1 at %.

15. The method of claim 12, further comprising:
   removing the sacrificial layers to form gap regions that expose the first sub-blocking layer, wherein
   the gap regions do not expose the second sub-blocking layer.

16. A method of manufacturing a semiconductor device, the method comprising:
   forming a vertical hole that penetrates a preliminary stack structure on a substrate, the preliminary stack structure including a plurality of first layers and a plurality of second layers that are alternately and repeatedly stacked on top of each other on the substrate, a material of the first layers being different than a material of the second layers;
   forming a blocking insulation layer in the vertical hole, the forming the blocking insulation layer including forming a first oxidation target layer, forming a first sub-blocking layer by oxidizing the first oxidation target layer, and forming a second sub-blocking layer such that the first sub-blocking layer is between the second sub-blocking layer and an inner sidewall of the vertical hole.

17. The method of claim 16, wherein
the forming the first oxidation target layer includes forming the first oxidation target layer to include silicon or silicon nitride, and
the forming the first sub-blocking layer includes forming the first sub-blocking layer to include silicon oxide based on oxidizing the silicon or silicon nitride included in the first oxidation target layer.

18. The method of claim 16, wherein
the forming the second sub-blocking layer includes depositing silicon oxide on the substrate, and
the oxidizing the first oxidation target layer is performed after the forming the second sub-blocking layer.

19. The method of claim 16, further comprising:
forming a vertical channel structure in the vertical hole, wherein
the first layers are insulation layers,
the second layers are sacrificial layers, and
the forming the vertical channel structure includes the forming the blocking insulation layer in the vertical hole and forming a semiconductor pattern.

20. The method of claim 19, further comprising:
removing the sacrificial layers to form gap regions, wherein
the gap regions expose the first sub-blocking layer, and
the gap regions do not expose the second sub-blocking layer.

* * * * *